US011215675B2

(12) United States Patent
Shin et al.

(10) Patent No.: US 11,215,675 B2
(45) Date of Patent: Jan. 4, 2022

(54) METHOD TO ESTIMATE BATTERY HEALTH FOR MOBILE DEVICES BASED ON RELAXING VOLTAGES

(71) Applicant: THE REGENTS OF THE UNIVERSITY OF MICHIGAN

(72) Inventors: Kang G. Shin, Ann Arbor, MI (US); Liang He, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 26 days.

(21) Appl. No.: 16/605,893

(22) PCT Filed: Apr. 17, 2018

(86) PCT No.: PCT/US2018/027923
§ 371 (c)(1),
(2) Date: Oct. 17, 2019

(87) PCT Pub. No.: WO2018/195049
PCT Pub. Date: Oct. 25, 2018

(65) Prior Publication Data
US 2020/0191876 A1 Jun. 18, 2020

Related U.S. Application Data

(60) Provisional application No. 62/486,144, filed on Apr. 17, 2017.

(51) Int. Cl.
G06F 11/30 (2006.01)
G01R 31/392 (2019.01)
(Continued)

(52) U.S. Cl.
CPC ....... G01R 31/392 (2019.01); G01R 31/3648 (2013.01); G01R 31/3835 (2019.01)

(58) Field of Classification Search
CPC .................................................. G01R 31/392
See application file for complete search history.

(56) References Cited

U.S. PATENT DOCUMENTS

2010/0219836 A1  9/2010 Svensson et al.
2014/0312912 A1  10/2014 Berkowitz et al.
(Continued)

FOREIGN PATENT DOCUMENTS

CN     102341721 A    2/2012
CN     104181468 A    12/2014
(Continued)

OTHER PUBLICATIONS

International Search Report and Written Opinion of the International Searching Authority issued in PCT/US2018/027923, dated Aug. 22, 2018; ISA/KR.

Primary Examiner — Phuong Huynh
(74) Attorney, Agent, or Firm — Harness, Dickey & Pierce, P.L.C.

(57) ABSTRACT

Mobile devices are only as useful as their battery lasts. Unfortunately, the operation and life of a mobile device's battery degrade over time and usage. The state-of-health (SoH) of batteries quantifies their degradation, but mobile devices' support for its estimation is very poor due mainly to the limited hardware and dynamic usage patterns, causing various problems such as shutting off the devices unexpectedly. To remedy this lack of support, a low-cost user-level SoH estimation service is developed for mobile devices based only on their battery voltage, which is already available on all commodity mobile devices. The design of the estimation service is inspired by an empirical observation that the relaxing voltages of a device battery fingerprint its SoH, and is steered by extensive measurements with 13

(Continued)

batteries used for various devices, such as Nexus 6P, Nexus 5X, Xperia Z5, Galaxy S3, iPhone 6 Plus, etc.

18 Claims, 25 Drawing Sheets

(51) Int. Cl.
    *G01R 31/3835*      (2019.01)
    *G01R 31/36*      (2020.01)

(56) References Cited

U.S. PATENT DOCUMENTS

| | | |
|---|---|---|
| 2016/0011273 A1 | 1/2016 | Mattisson et al. |
| 2017/0038436 A1* | 2/2017 | Montaru .............. G01R 31/367 |
| 2020/0198495 A1* | 6/2020 | Rizzoni .................. B60L 50/51 |

FOREIGN PATENT DOCUMENTS

| | | |
|---|---|---|
| CN | 104569844 A | 4/2015 |
| CN | 104597406 A | 5/2015 |
| JP | 2004129335 * | 4/2004 |
| JP | 2004129355 A | 4/2004 |
| JP | 2009186235 A | 8/2009 |
| WO | WO-2015049300 A1 | 4/2015 |
| WO | WO-2015079559 A1 | 6/2015 |

* cited by examiner $$SoH = C_{fullcharge} / C_{design} \times 100\%$$

$$SoC = C_{remaining} / C_{fullcharge} \times 100\%$$

$$SoC = C_{remaining} / (SoH \times C_{design}) \times 100\%$$

METHOD TO ESTIMATE BATTERY HEALTH FOR MOBILE DEVICES BASED ON RELAXING VOLTAGES

CROSS-REFERENCE TO RELATED APPLICATIONS

This application is the U.S. National Phase Application under 35 U.S.C. 371 of International Application No. PCT/US2018/027923, filed on Apr. 17, 2018, which claims the benefit of U.S. Provisional Application No. 62/486,144, filed on Apr. 17, 2017. The entire disclosures of the above applications are incorporated herein by reference.

GOVERNMENT CLAUSE

This invention was made with government support under Grant No. CNS1446117 awarded by the National Science Foundation. The Government has certain rights in this invention.

FIELD

The present disclosure relates to a method to estimate battery health for mobile devices based on relaxing voltages.

BACKGROUND

Batteries, the hearts of mobile devices, have recently exhibited serious safety and fiscal risks (e.g., the recent Samsung's Note 7 crisis) due mainly to the continuous push for small-size, fast-charging, and high-energy/power density batteries to meet ever-increasing p/service demands, making their holographic monitoring and diagnosis crucial.

Sadly, we can't even answer confidently a simple question "how long will my phone battery last?", which means the remaining battery life (e.g., relative to the battery warranty period) or remaining device operation time until the battery runs out (i.e., the operation time with a single charge), thus impeding the diagnosis of shortened device operation time and causing unexpected device shut-offs. This is because the answer is grounded on the quantification of battery's capacity fading, which is traditionally captured by its state-of-health (SoH) and defined as the ratio of the battery's full charge capacity to the designed capacity. Unfortunately, mobile devices are not equipped with the capability needed for quantifying its battery's SoH. For example, Android only specifies battery health as good or dead, without any quantified information. FIG. 1 plots measurements for the battery SoH of four Android phones with a battery tester: all of these batteries are tagged as good although their capacities are observed to have faded down by as much as 52%. iOS apps, such as CoconutBattery and iBackupBot, estimate battery SoH for iPhones and MacBooks, but their estimations are known to be unreliable and fluctuating.

The non-existence of quantified battery SoH prevents the comparison of a device's battery life against its warranty period, as users won't know whether the shortened device operation is due to system updates and app installations, or because of battery fading. It also introduces errors when estimating devices' remaining power and thus shutting them off prematurely or unexpectedly, as batteries' state-of-charge (SoC) is grounded on their SoH by definition. For example, mobile devices have been shut off even while showing 10-30% remaining power. Apple has recently announced a free-replacement program of iPhone 6S batteries because of this problem, and concluded faster-than-normal SoH degradation to have caused the problem. Last but not least, this inaccurate SoC easily leads to battery over-charging/deep-discharging, accelerating SoH degradation and thus increasing SoC error, thus forming a positive feedback loop between the two.

The deficiency of health information on mobile devices' batteries stems from the non-existence of compatible methods to estimate their SoH. Most existing SoH estimation methods require either battery parameters, determination of which is beyond mobile devices' capability due to hardware limitation (e.g., impedance and ultrasonic echo), or specific applicable conditions that do not always hold due to devices' dynamic usage patterns (e.g., small current to fully charge and discharge). Moreover, even Coulomb counting—the most widely-deployed SoH estimation method via current integration—is not supported well on mobile devices because (i) not all power management ICs (PMICs) of mobile devices support electric current sensing, making Coulomb counting infeasible; and (ii) the PMIC-provided current information is coarse and lacks real-time capability, even when available. Such unreliable current information on mobile devices is also reported by Ampere, a current sensing app with millions of downloads.

This section provides background information related to the present disclosure which is not necessarily prior art.

SUMMARY

This section provides a general summary of the disclosure, and is not a comprehensive disclosure of its full scope or all of its features.

A method is presented for estimating state-of-health (SofH) of a rechargeable battery powering an apparatus, such as a phone or mobile device. A set of fingerprints is provided for a battery of a given type used by the apparatus, where each fingerprint links a quantified SofH for the battery to a given predetermined model for the relaxing voltage of the battery and the given predetermined model describes relaxing voltage of the battery at two or more points over a fixed period of time while the battery is resting. The method includes: measuring voltage of a given battery of the given type over the fixed period of time while the given battery is resting; constructing a present model for the given battery from the voltage measurements; and determining a SofH for the given battery by comparing the present model to the set of fingerprints. The battery is preferably until the battery is fully charged and the voltage across the given battery is measured after the given battery is fully charged.

In an example embodiment, the present model is constructed using regression analysis. For example, the present model is constructed by fitting the voltage measurements to an exponential function; filtering out the voltage measurements using the exponential function; and smoothing filtered voltage measurements with a moving average, thereby yielding the present model for the given battery. The exponential function can be further defined as a power function. Dimensionality of the voltage measurements can also be reduced by apply principle component analysis.

In the example embodiment, the present model is compared to the set of fingerprints using a regression tree.

In some instances, uninterrupted voltage measurements are difficult to obtain due to background tasks. To address this situation, segments of time are identified when the battery is resting, voltage measurements are extracted from the identified segments of time, and the present model is constructed from the extracted voltage measurements. Different battery services can be provided based on the determined SofH of the battery. For example, the usable capacity of the battery can be converted to a remaining usage time using the determined SofH of the battery which can in turn be displayed to a user of the apparatus.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
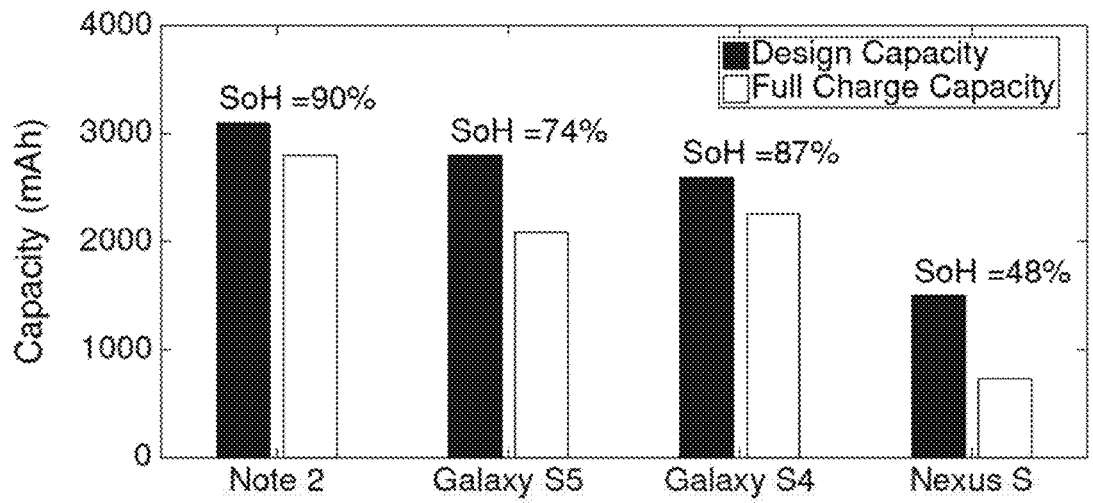
FIG. 1 is a graph showing deficient SoH information for different mobile devices.
Figure 2:
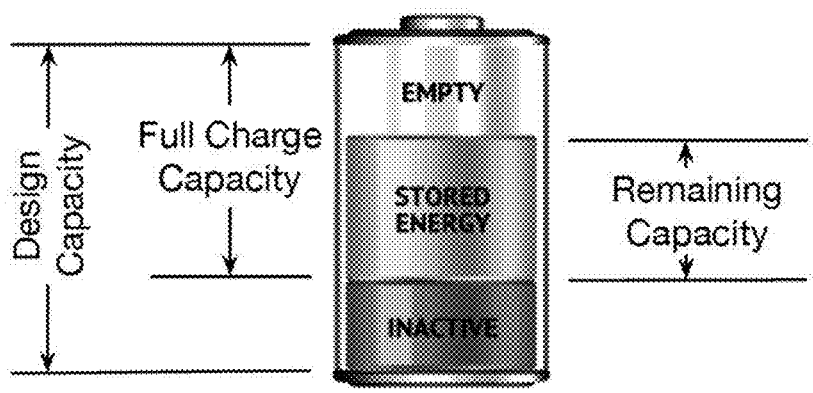
FIG. 2 is a diagram showing SoH for a battery.
Figure 3A:
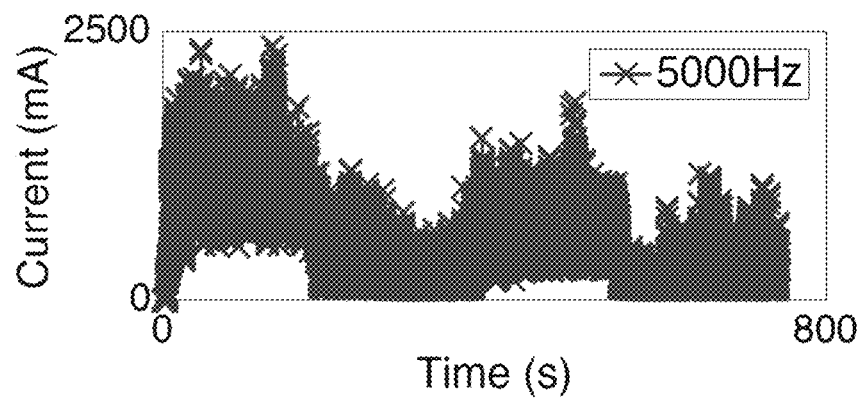
FIGS. 3A-3F are graphs depicting how an insufficient sampling rate amplifies the error in Coulomb counting.
Figure 3B:
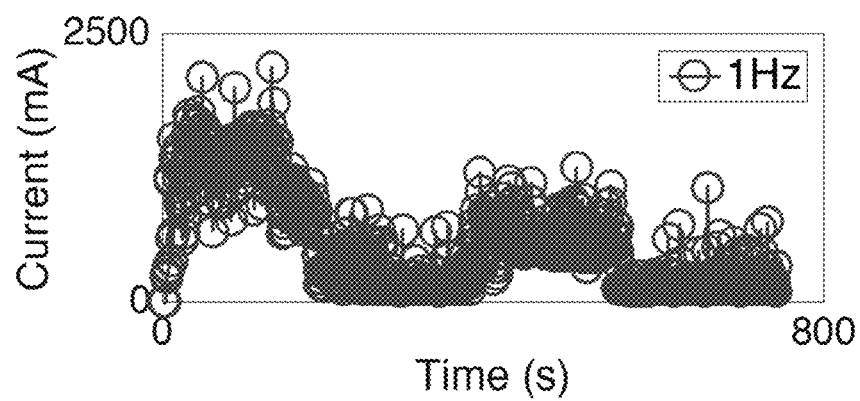
Figure 3C:
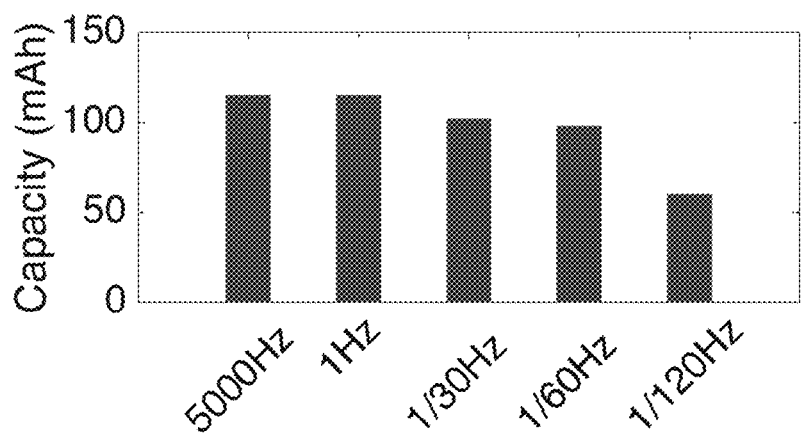
Figure 3D:
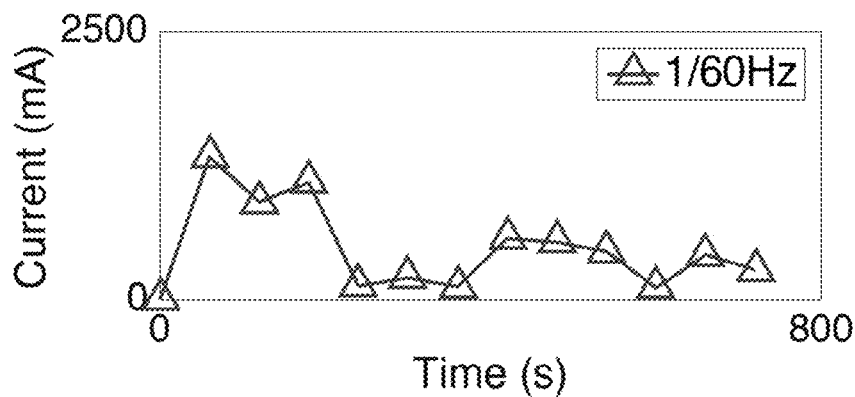
Figure 3E:
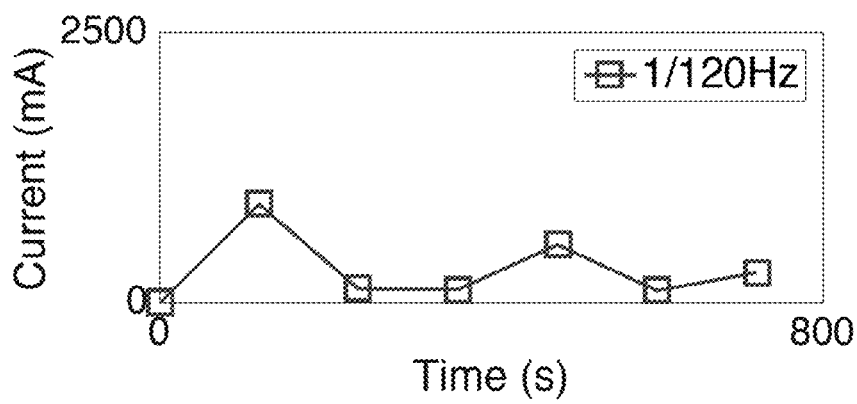
Figure 3F:
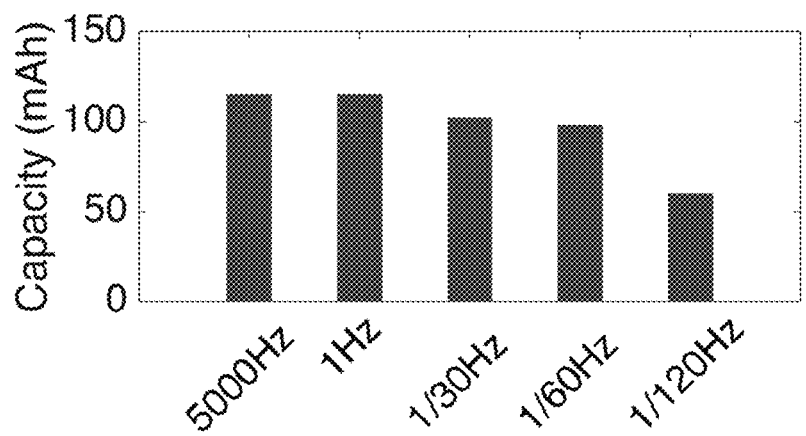

State of Health (SoH) is one of the most critical battery parameters, quantifies battery's capacity fading, and is defined as the ratio of battery's full charge capacity $C_{fullcharge}$ to its designed levels $C_{design}$ $$SoH = \frac{C_{fullcharge}}{C_{design}} \times 100\%.$$

State of Health (SoH) is one of the most critical battery parameters, quantifies battery's capacity fading, and is defined as the ratio of battery's full charge capacity $C_{fullcharge}$ to its designed levels $C_{design}$ $$SoH = \frac{C_{fullcharge}}{C_{design}} \times 100\%.$$

$C_{fullcharge}$ is the foundation of SoH estimation, which is usually estimated via Coulomb counting, i.e., integrating the current when discharging/charging the battery between two SoC levels to calculate the discharged/charged capacity as $$\Delta C = \int_{t(SoC_1)}^{t(SoC_2)} i(t)dt,$$

where i(t) is the current at time t. This way, we know $$C_{fullcharge} = \frac{\Delta C}{|SoC_1 - SoC_2|}$$

Commodity mobile devices do not support Coulomb counting well in terms of availability, accuracy, and timeliness, thus making it difficult to estimate their battery SoH.

First, not all the PMICs, or more specifically, their fuel gauge components of mobile devices support current sensing.

Moreover, the PMIC-provided current information, even when available, is very coarse. Commodity mobile devices estimate theft current with a series-connected resistor r, measure the voltage v across the resistor, and estimate the current as i=v/r. The resistor causes the side effect of heating (i.e. $i^2 r$), which must be low, thus requiring a small r. For example, Maxim requires <0.5 mW heating overhead, indicating r<5 MΩ for devices operating with 100 mA current. Such a small value, however, reduces the voltage across the resistor and thus degrades current-sensing accuracy. Also, resistance is dependent on temperature which varies, easily causing 5-10% resistance variations.

Lastly, the current information may lack timeliness, which is crucial for Coulomb counting because devices' currents are known to be highly dynamic, i.e., varying from tens to thousands of milliamps in a few milliseconds. For example, Android's BatteryManager supports only two sampling rates: a sample every 1 minute and every 10 minutes. Even directly accessing the PMIC-provided current information may not achieve fine-grained current sensing, because of its low update frequency. To illustrate the degraded Coulomb counting due to the insufficient sampling rate, a 12-minute current trace was collected from a Galaxy S5 phone with the Monsoon power monitor running at 5,000 Hz, during which 114 mAh capacity is discharged. Then, based on this trace, Coulomb counting was implemented by emulating different sampling rates of 1 Hz, 1/30 Hz, 1/60 Hz, and 1/120 Hz, achieving the discharged capacity of 115 mAh, 109 mAh, 98 mAh, and 60 mAh, respectively—insufficient sampling rates cause up to 47% counting error (FIG. 3). Note that the error of Coulomb counting accumulates over time.

Mobile devices' deficiency in supporting Coulomb counting and their limited SoH information motivated us to explore current-free SoH estimation which is also referred to herein as V-Health estimation method.

Figure 4A:
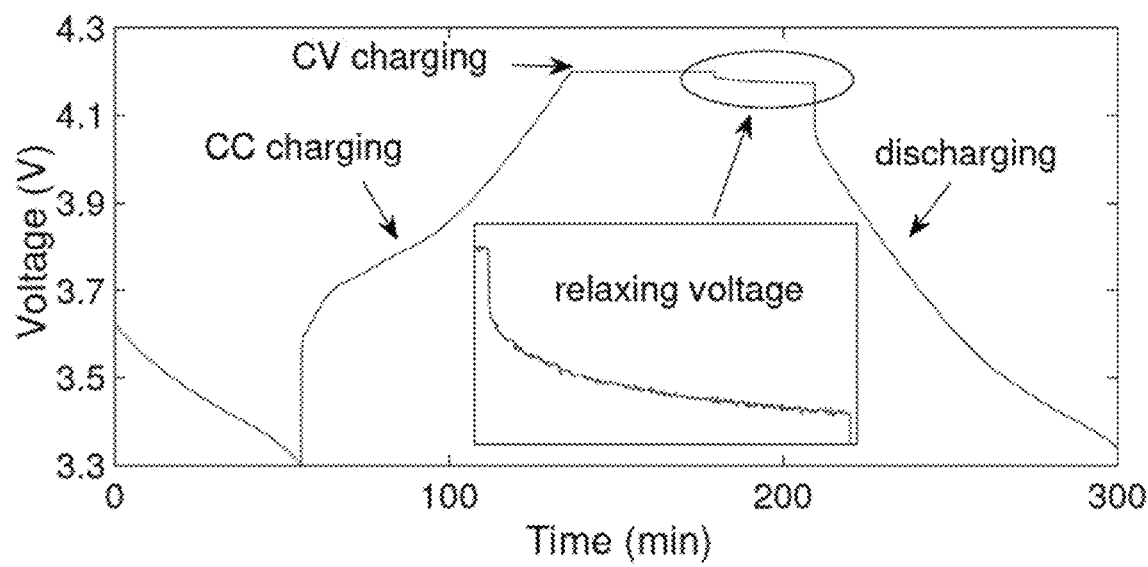
FIG. 4A is a graph showing a voltage curve during one charging/resting/discharging cycle.

V-Health estimation method is built on a key finding that batteries' relaxing voltages fingerprint their SoH. This finding is demonstrated with a 2,200 mAh Galaxy S3 battery. Specifically, the battery was tested by (i) fully charging it with a constant-current constant-voltage (CCCV) profile of <0.5 C, 4.2V, 0.05 C$>_{cccv}$ as commonly specified in Li-ion battery datasheet, (ii) resting it for 30 minutes, (iii) fully discharging it at 0.5 C-rate until reaching a cutoff voltage of 3.3V, at which mobile devices normally shut off, and (iv) repeating the process for 300 cycles. This measurement is made with the NEWARE BTS4000 battery tester, and the cycling process (i.e., current, voltage, timestamp) is logged at 1 Hz. FIG. 4A plots the battery voltage during one such charging/testing/discharging cycle, and highlights the relaxing voltages during resting. The relaxing voltage drops instantly upon resting and then decreases gradually until it converges.

Figure 4B:
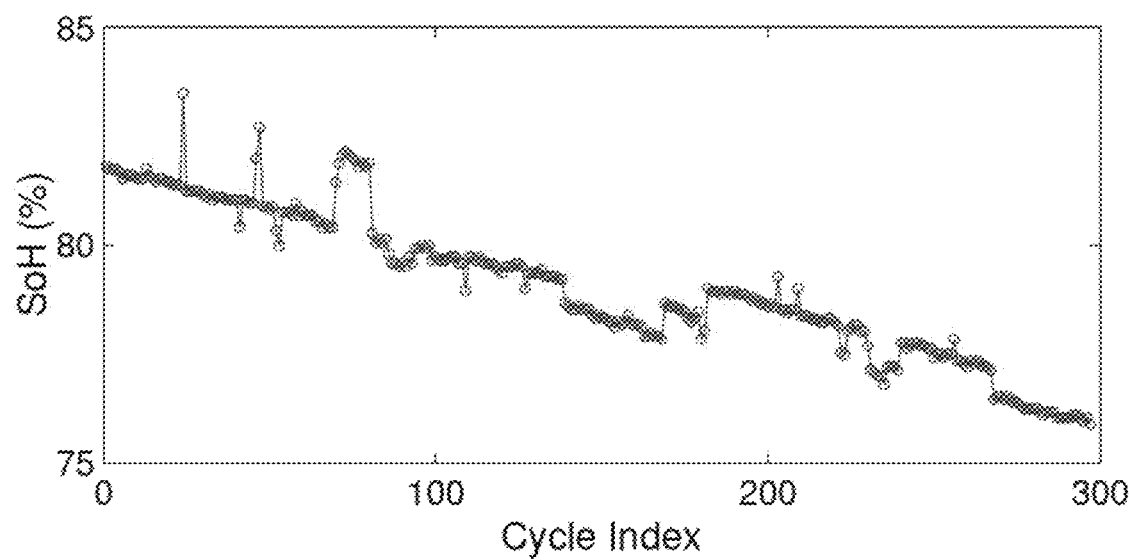
FIG. 4B is a graph showing how battery SofH degrades over multiple cycles.
Figure 4C:
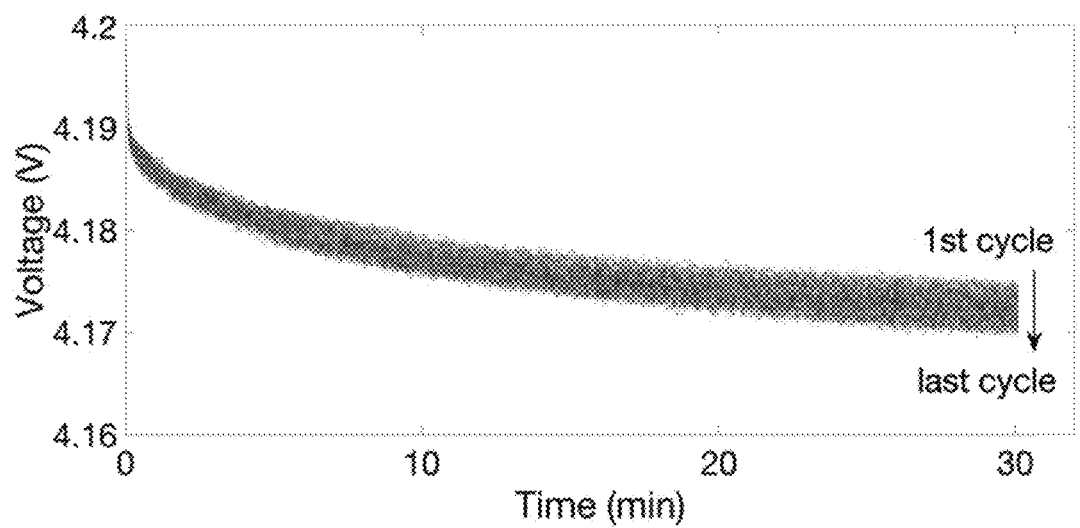
FIG. 4C is a graph showing how the relaxing voltage decreases during a relaxing period.

The battery's full charge capacity is collected (and its SoH according to Eq. (1)) via Coulomb counting during discharging, thus recording its degradation process during the cycling measurement, as shown in FIG. 4B. Also, 300 time series of relaxing voltages are collected, each during one of the 30-minute resting period as seen in FIG. 4C. Comparison of FIGS. 4B and 4C shows that the battery SoH degrades over the cycling measurement due to its capacity fading, while during the same measurement, its relaxing voltage decreases, exhibiting the possibility to fingerprint battery SoH with the relaxing voltages.

Figure 4D:
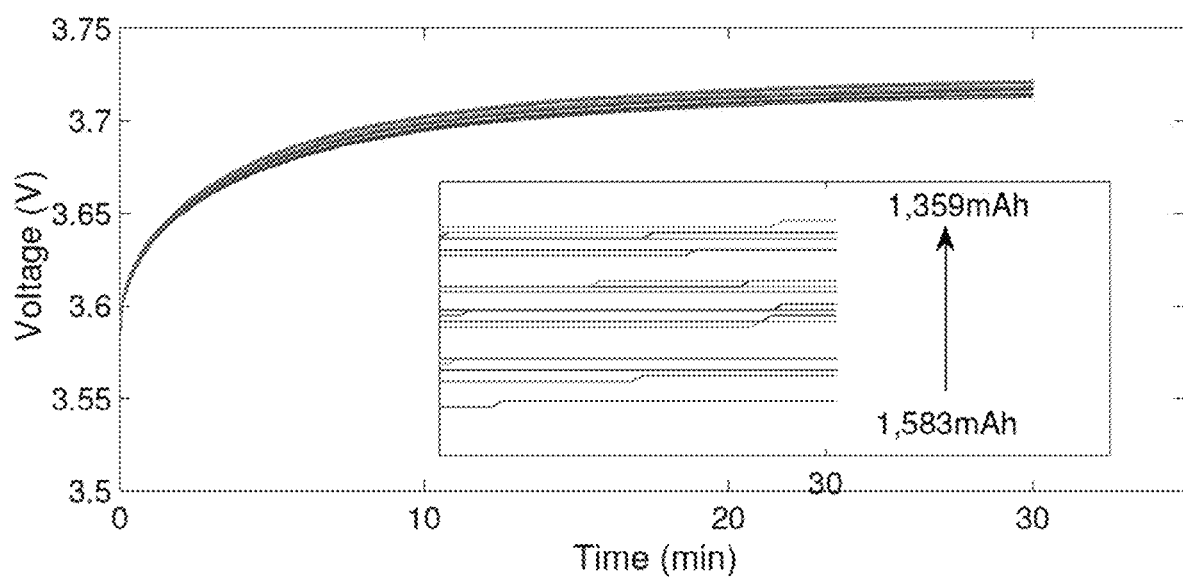
FIG. 4D is a graph showing that the after-discharging relaxing voltages also fingerprint battery SoH.

Correlation between SoH degradation and the relaxing voltages after battery discharging is also observed, as shown in FIG. 4D over a 120-cycle measurement. Note that not all the relaxing traces are plotted for clarity. The battery is charged with <0.5 C, 4.2V, 0.05 C$>_{cccv}$, discharged at 0.5 C-rate until reaching a cutoff voltage of 3.5V, and rested for 30 minutes in each cycle. The battery SoH degrades over the measurement, while at the same time the relaxing voltages increase.

Figure 5:
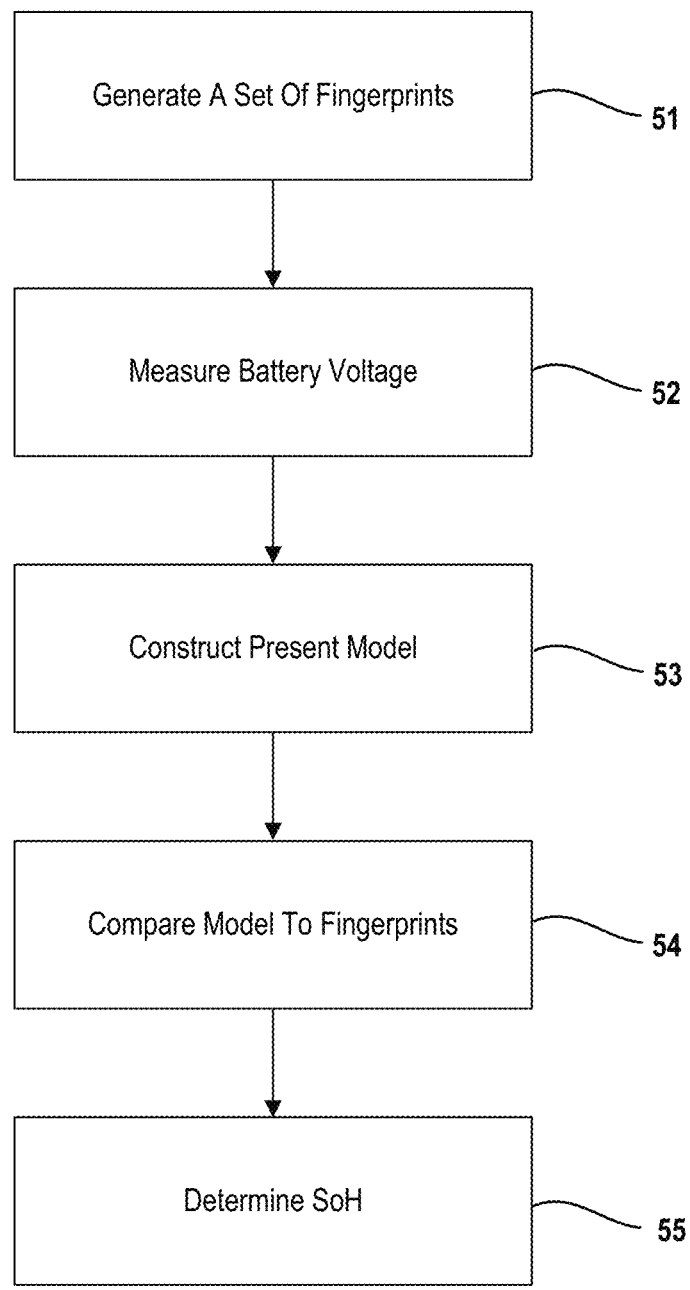
FIG. 5 is a flowchart depicting an example method for estimating state-of-health (SofH) of a rechargeable battery shows.

V-Health estimation method exploits this voltage-SoH relationship to estimate the SoH of device batteries by checking their relaxing voltages with an offline-constructed fingerprint map. FIG. 5 provides an overview of an example method for estimating state-of-health (SofH) of a rechargeable battery. First, a set of fingerprints are constructed at 51 for a battery of a given type. Each fingerprint links a quantified SofH (e.g., 70% or 85% of the initial capacity) for the battery to a predetermined model for the relaxing voltage of the battery. The model describes relaxing voltage of the battery at two or more points over a fixed period of time after the battery has been fully charged. A technique for constructing fingerprints is further described below. In the context of a mobile device, the set of fingerprints are determined in advance and stored in a computer memory of the mobile device for subsequent use.

To estimate SofH, the voltage of a battery (of the same type as those used to construct the fingerprints) is measured at 52 over the same fixed period of time (e.g., 30 minutes) while the battery is resting. In an example embodiment, the battery is charged to full capacity and then allowed to rest. Voltage measurements are then taken during a resting period immediately following the charging of the battery. It is envisioned that battery voltage may be measured during other resting periods but preferably under that same conditions in which the fingerprints were constructed.

From the voltage measurements, a present model for the relaxing voltage is constructed in the same manner as was used to construct the fingerprints. In the example embodiment, the model is constructed using regression analysis as will be further described below. The present model is then compared at 54 to each of the models in the set of fingerprints. In the example embodiment, the present model is compared to the models in the set of fingerprints based on the set of decision rules defined by a regression tree. The SofH of the battery is deemed to be the quantified value associated with the model that most closely correlates to the present model as indicated at 55. For example, if the present model closely correlates to the model linked with 75% SofH, then the SofH of the battery is estimated to be 75%.

Figure 6:
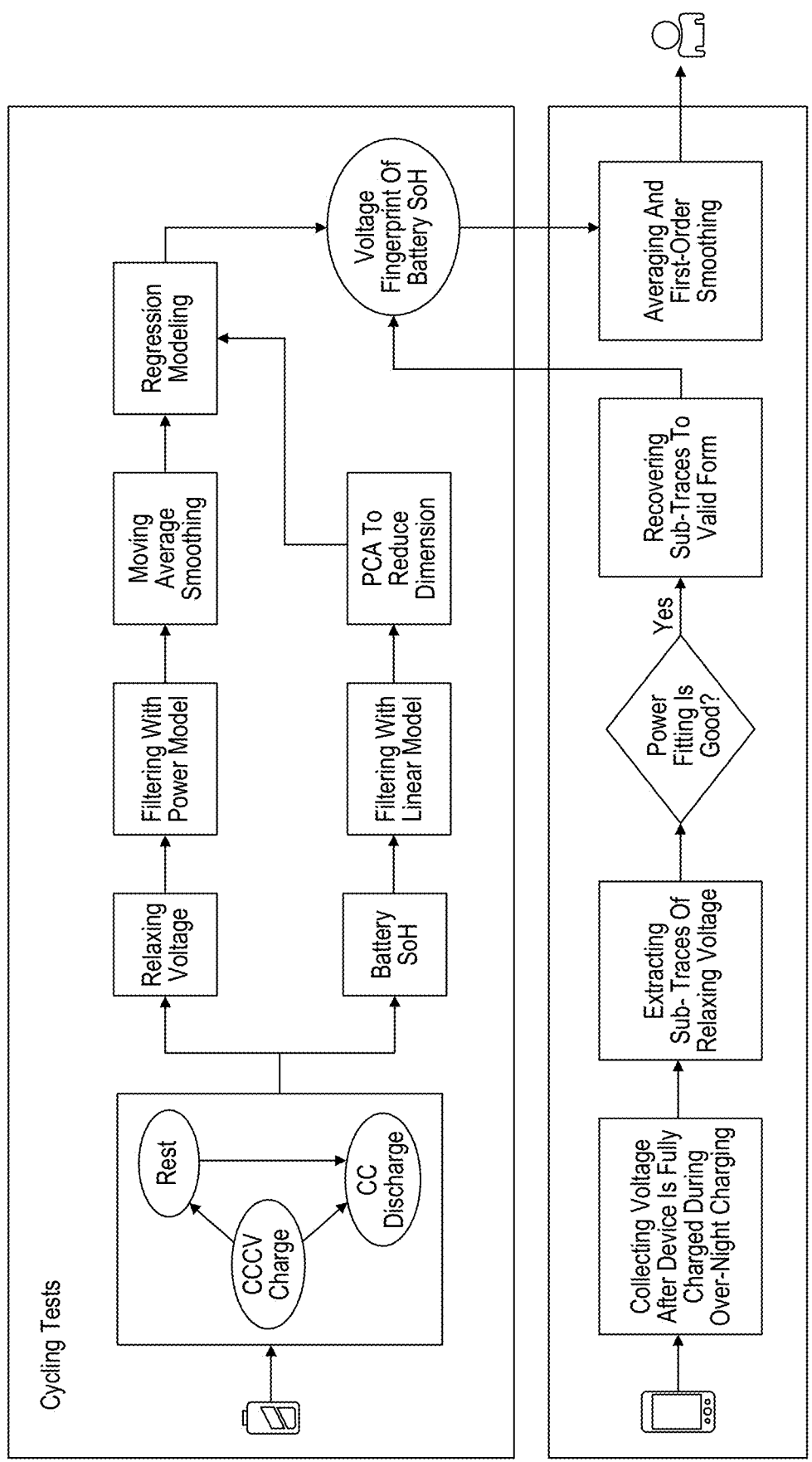
FIG. 6 is a diagram depicting an example embodiment of the estimation method.
Figure 7:
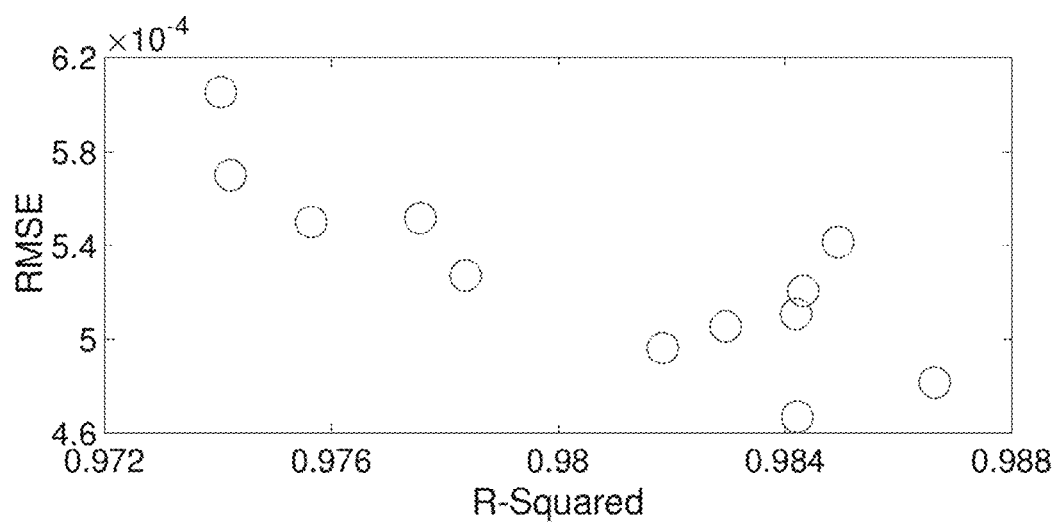
FIG. 7 is a graph illustrating linear fitting of SoH degradation.

FIG. 6 further describes an example embodiment for estimating battery health based on relaxing voltages. The top portion depicts how the fingerprints are constructed; whereas the bottom portion depicts how an estimation is made by a mobile device using the fingerprints.

Knowledge of batteries' SoH degradation and relaxing voltages is necessary to characterize their relationship with extensive battery cycling tests. Such tests are readily available for smartphone OEMs, such as Samsung and Apple when testing their products, but are not available for non-OEM researchers/engineers. Therefore, extensive battery cycling measurements were conducted with 13 batteries used for various mobile devices as summarized in Table 3 (including the one shown in FIG. 4); the measurements consist of 7,462 cycles in total and last over 44 months cumulatively.

TABLE 3

| Battery | Rated Capacity | Total # of Tests | Total # of Cycles | Per-Cycle Profile |
| --- | --- | --- | --- | --- |
| Nexus 6P × 1 | 3,450 mAh | 4 | 700 | <0.5 C, 4.35 V, 0.05 C$>_{cccv}$; 30 min rest; 0.5 C DChg to 3.3 V |
| Nexus 5X × 2 | 2,700 mAh | 2 | 519 | <0.5 C, 4.35 V, 0.05 C$>_{cccv}$; 30 min rest; 0.5 C DChg to 3.3 V |
| Nexus S × 1 | 1,500 mAh | 3 | 150 | <0.5 C, 4.20 V, 0.05 C$>_{cccv}$; 30 min rest; 0.5 C DChg to 3.2 V |
| Xperia Z5 × 1 | 2,900 mAh | 4 | 400 | <0.5 C, 4.20 V, 0.05 C$>_{cccv}$; 30 min rest; 0.5 C DChg to 3.2 V |
| iPhone 6 Plus × 1 | 2,900 mAh | 2 | 100 | <0.5 C, 4.35 V, 0.05 C$>_{cccv}$; 30 min rest; 0.5 C DChg to 3.3 V |

TABLE 3-continued

| Battery | Rated Capacity | Total # of Tests | Total # of Cycles | Per-Cycle Profile |
|---|---|---|---|---|
| Galaxy Note 2 × 1 | 3,1800 mAh | 5 | 350 | <0.5 C, 4.20 V, 0.05 C>$_{cccv}$; 30 min rest; 0.5 C DChg to 3.2 V |
| Galaxy S5 × 1 | 2,800 mAh | 3 | 417 | <0.5 C, 4.35 V, 0.05 C>$_{cccv}$; 30 min rest; 0.5 C DChg to 3.3 V |
| Galaxy S4 × 1 | 2,600 mAh | 6 | 634 | <0.5 C, 4.20 V, 0.05 C>$_{cccv}$; 30 min rest; 0.5 C DChg to 3.0 V |
| Galaxy S3 × 4 | 2,200 mAh | 12 | 3,612 | <0.5 C, 4.20 V, 0.05 C>$_{cccv}$; 30 min rest; 0.5 C DChg to 3.3 V |
| | — | 4 | 580 | <0.25 C, 4.20 V, 0.05 C>$_{cccv}$; 30 min rest; 0.5 C DChg to 3.3 V |

In these measurements, the settings of <0.5 C, 4.2V, 0.05 C>$_{cccv}$ and $V_{cutoff}$=3.0V are commonly used to specify battery properties in industry during battery testing, and $V_{max}$=4.35V and $V_{cutoff}$ of 3.2-2.2V specify more device characteristics: mobile devices are normally charged to a maximum voltage of 4.3-4.4V and shut off when their battery voltage reduces to 3.2-3.3V.

Even though these measurements over 44 months may not suffice to capture the complete battery degradation (from 100% to 0% SoH), they are good enough to identify the voltage-SoH relationship within the SoH range users experience most (e.g., users rarely switch to new batteries until the old ones degrade to 0% SoH). Moreover, the thus-identified voltage-SoH relationship can be extended to the SoH ranges not covered by these measurements.

For the construction of fingerprints, twelve such measurements based on 4 Galaxy S3 batteries are used to elaborate on the construction of a voltage-based SoH fingerprint map. Each of these 12 measurements consists of charging/resting/discharging cycles, logged at 1 Hz. In this way, 12 SoH-degradation traces were collected, each from one measurement, and also recorded 3,612 time series of relaxing voltages, each from the resting period within a cycle. The same approach of fingerprint map construction is applied to all the batteries in Table 3 and evaluated as will be explain later in this disclosure.

Variance/noise exists in both the SoH degradation and relaxing voltages (as observed in FIG. 4), which is likely due to battery dynamics, especially when considering the stable laboratory environment (i.e., with an UPS connected and room temperature control) and the battery tester's high accuracy (i.e., less than 0.5% error in controlling the cycling processes). Such a variance in battery measurements has also been reported, necessitating pre-processing (i.e., filtering and smoothing) of data before constructing the fingerprint map. In the example embodiment, the collected data was filtered and smoothed using two empirically established models for the SoH degradation and relaxing voltages.

Figure 8:
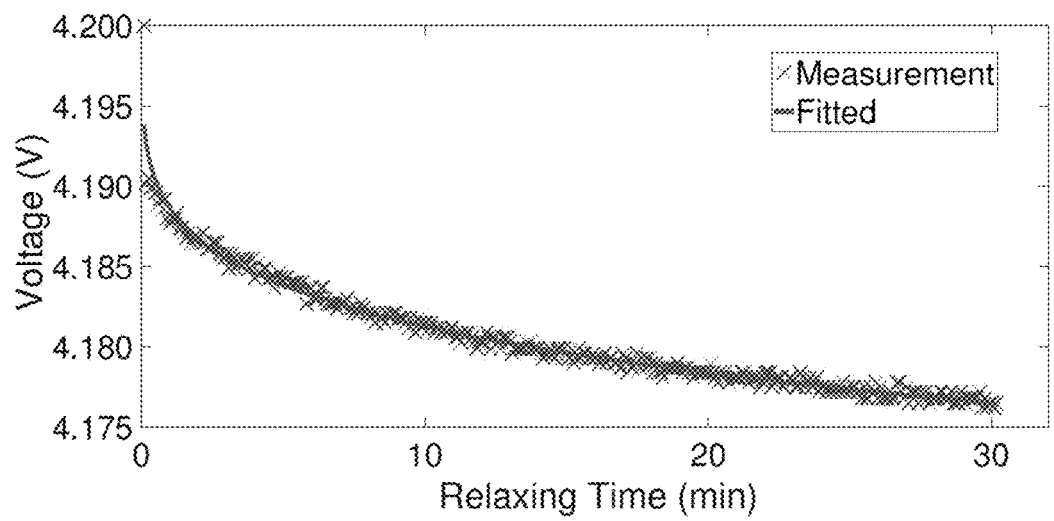
FIG. 8 is a graph illustrating collected relaxing voltages.
Figure 9:
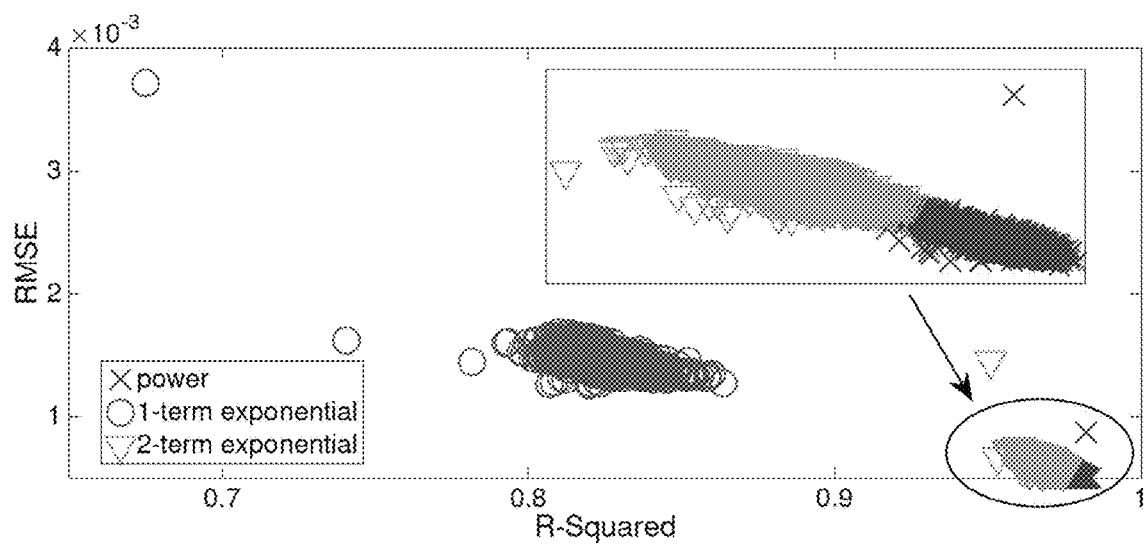
FIG. 9 is a graph illustrating the goodness of power fitting.

The battery health is shown to degrade approximately linearly (as observed in FIG. 4B) until it really becomes bad. To further validate this linear degradation, a linear fit was applied to the 12 collected SoH degradation processes, and all of them have an excellent goodness-of-fit in terms of root-mean-square error (RMSE) and R-Squared, as shown in FIG. 9 where each point represents the goodness-of-fit for a particular SoH degradation process. Outlier SoH samples can be removed based on this linear model—those SoH samples deviating too much from the linear fitting (e.g., >0.5% SoH) are tagged as outliers and removed. Remaining samples are then smoothed with a moving average Against this backdrop, an example approach for constructing a present model from a set of voltage measurements is described. In an example embodiment, the V-Health estimation method first fits the voltage measures to an exponential function. Specifically, this approach filters and smooths the relaxing voltages based on another empirical observation that the relaxing voltages conform to a power function. Referring to FIG. 8, the power function is defined as $v(t)=a \cdot t^b$ c (t≥0), where t is the time since resting and a, b, and c are coefficient whose values are derived from the fitting. To illustrate, the power function is applied to the 3,612 collected relaxing voltage traces to statistically verify this observation. FIG. 9 summarizes the goodness-of-fit—the fitting RMSE is bounded below 0.0009 and the R-Squared above 0.965, showing excellent fitting accuracy. Note that this power model differs from existing models with exponential-shape relaxing voltages. FIG. 9 also plots the goodness-of-fit when fitting the same set of relaxing voltages as 1-term and 2-term exponential functions, i.e., $v(t)=a \cdot e^{t \cdot b}$ (t≥0) and $v(t)=a \cdot e^{t \cdot b}+c \cdot e^{t \cdot d}$ (t≥0), showing reasonably good accuracy, but not as good as the power fitting. Thus, other types of functions may be used to fit the voltage measures.

V-Health estimation method filters the relaxing voltages with this power model, e.g., tagging the relaxing voltage traces with the bottom 5% goodness-of-fit as outliers and discarding these measures. A moving average smoother is then used again to smooth the remaining valid relaxing voltage traces although other smoothing techniques are contemplated by this disclosure. In some embodiments, the remaining voltage measures serve as the present model for the battery.

Note that if an SoH sample is tagged as an outlier, so is the relaxing voltage in the same cycle, and vice versa. Also, V-Health estimation method only filters out the outliers based on these empirical models, instead of using the model fitting results to construct the fingerprint map, thus alleviating its dependency on model accuracy. As an example, 268 SoH samples and relaxing voltage traces are selected after the data pre-processing from the 300-cycle measurement shown in FIG. 4. Other techniques for filtering and smoothing the voltage measures also fall within the broader aspects of this disclosure.

Figure 10:
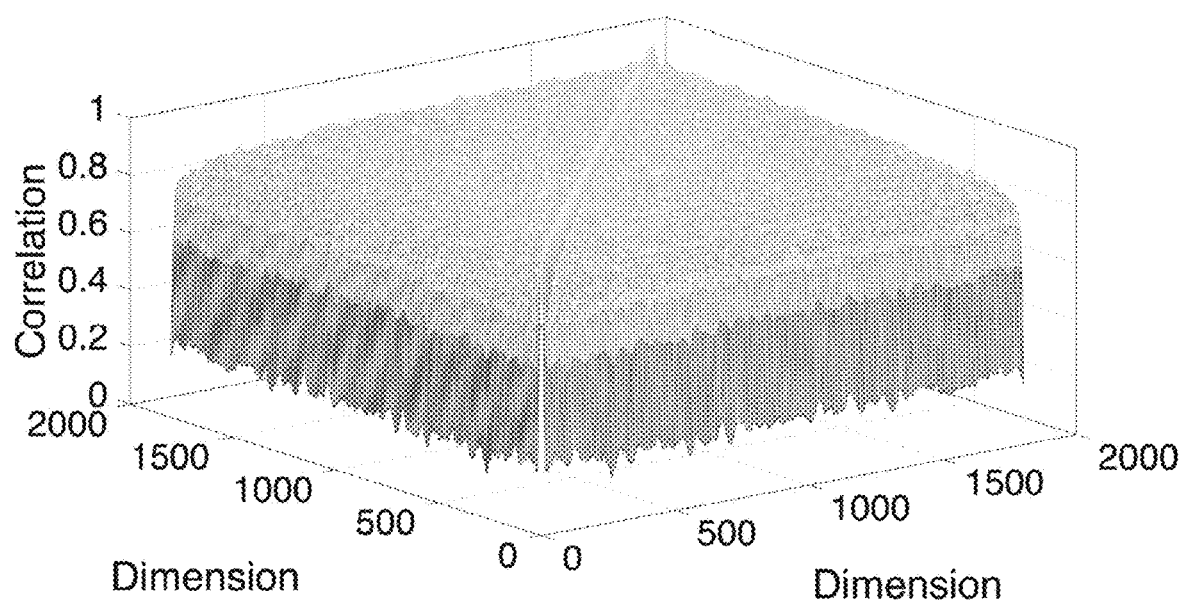
FIG. 10 is a graph illustrating that different dimensions in relaxing voltage are highly correlated.
Figure 11A:
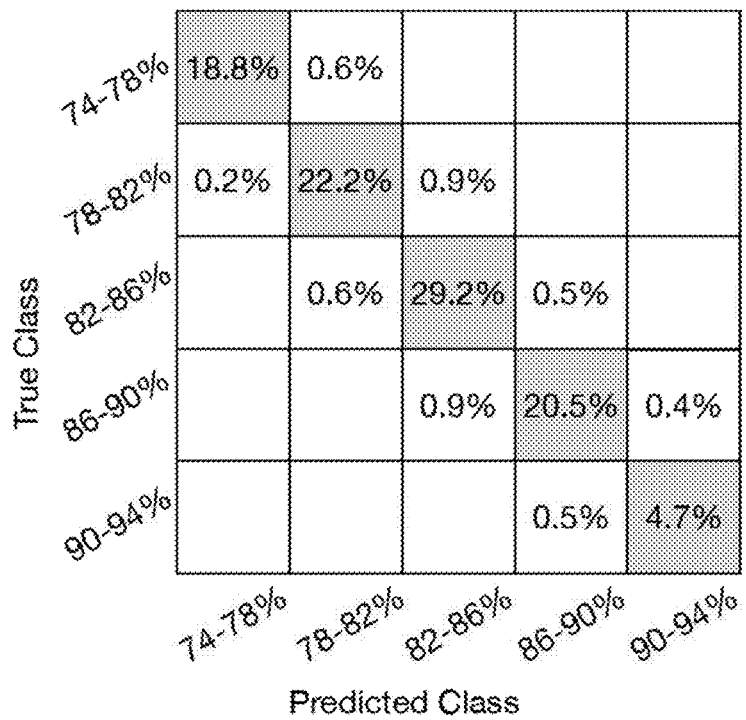
FIGS. 11A-11D are confusion matrices of the regression model for different battery types.
Figure 11B:
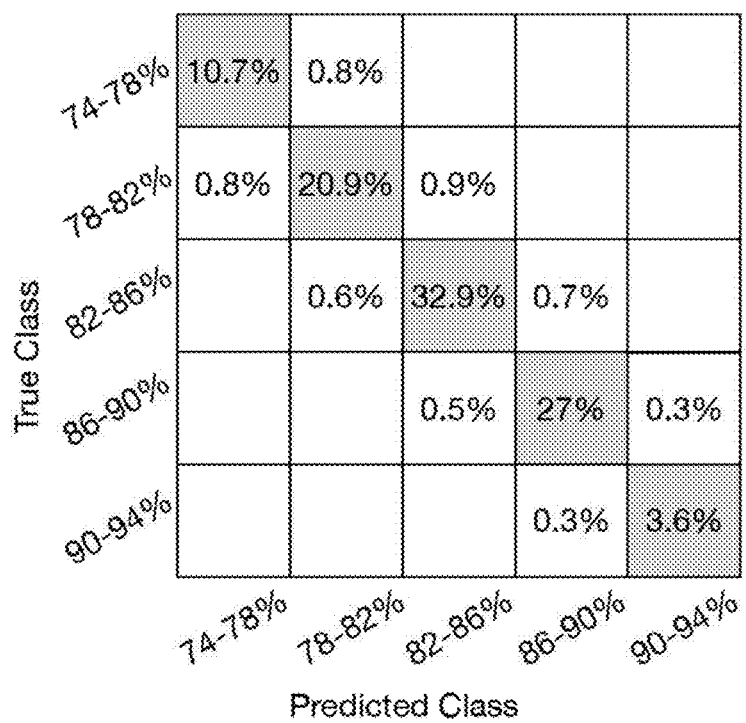
Figure 11C:
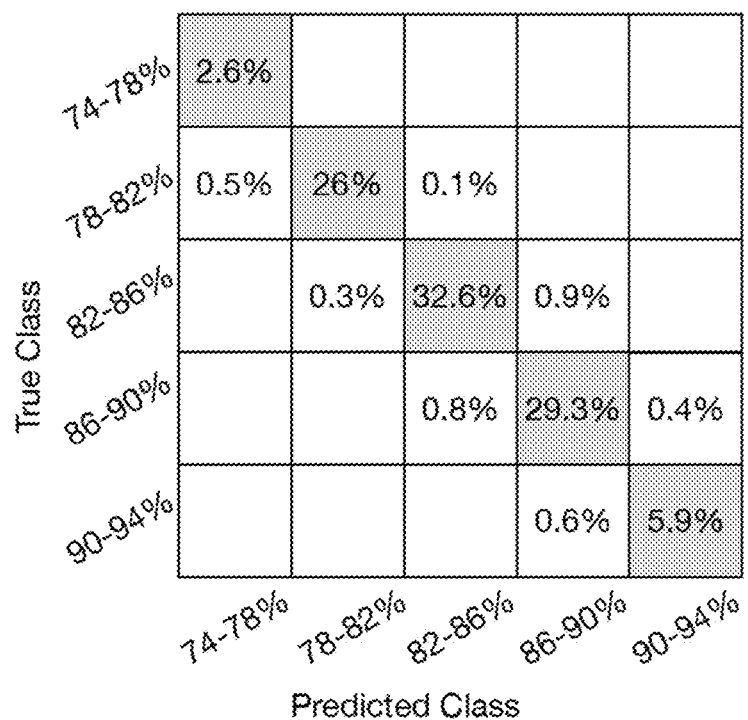
Figure 11D:
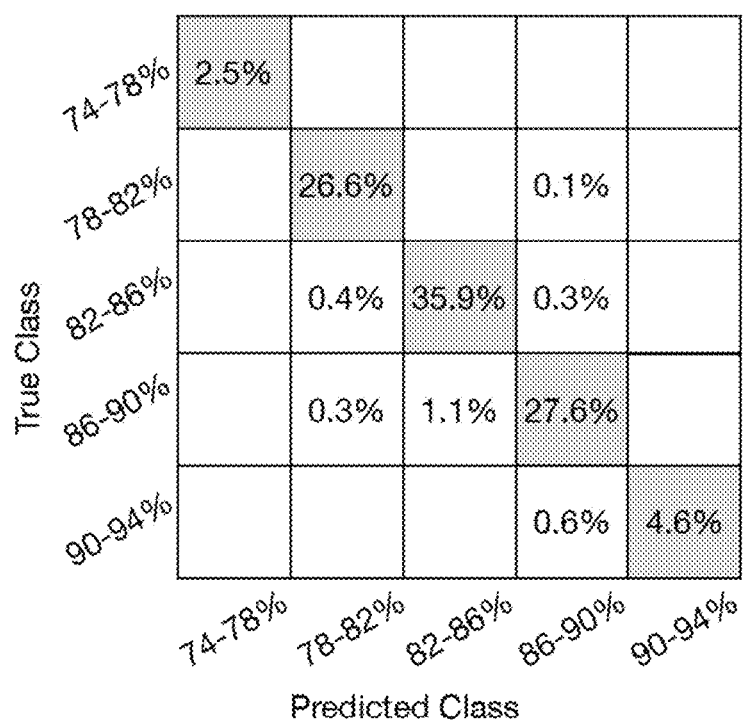
Figure 12A:
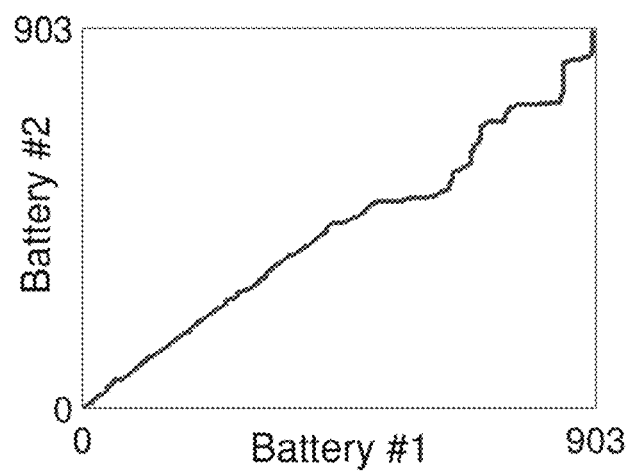
FIGS. 12A-12F are graphs showing similarity between degradation processes via dynamic time warping.
Figure 12B:
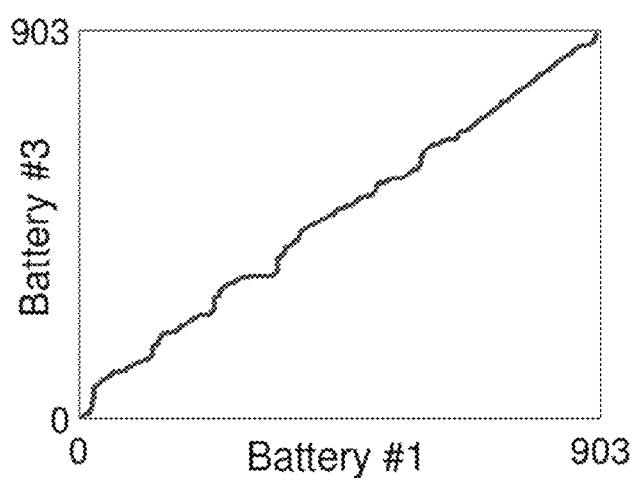
Figure 12C:
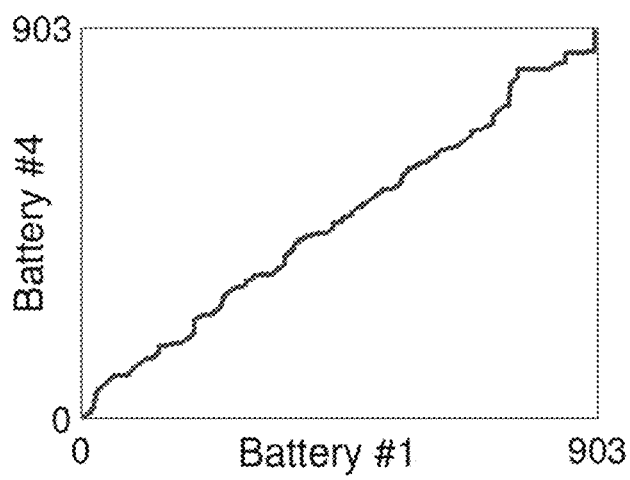
Figure 12D:
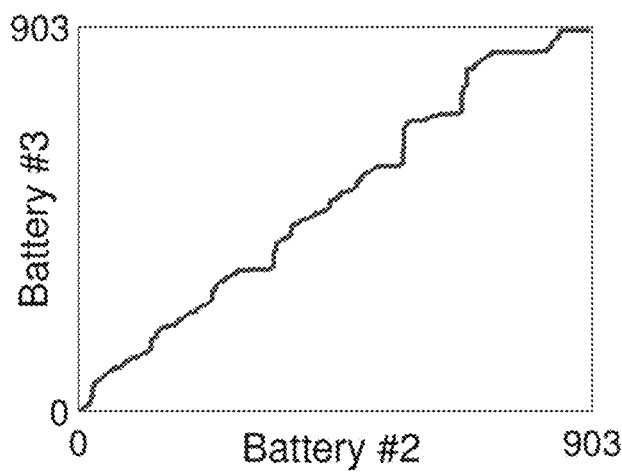
Figure 12E:
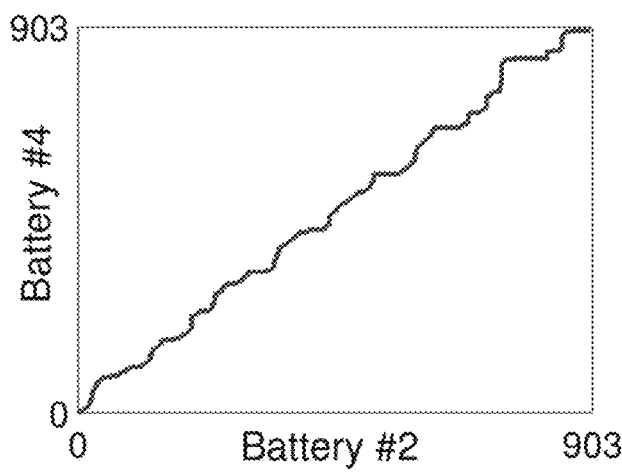
Figure 12F:
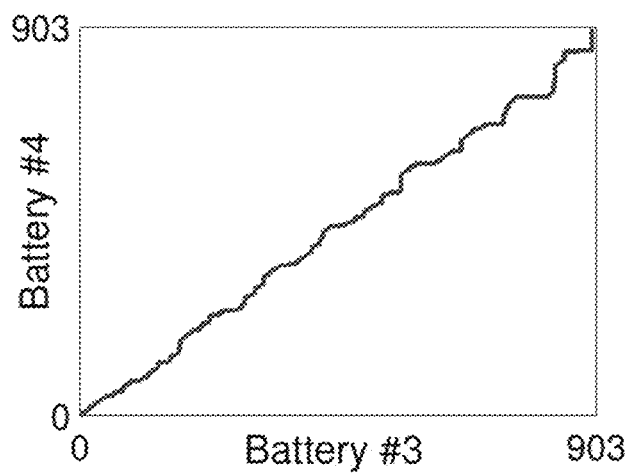
Figure 13:
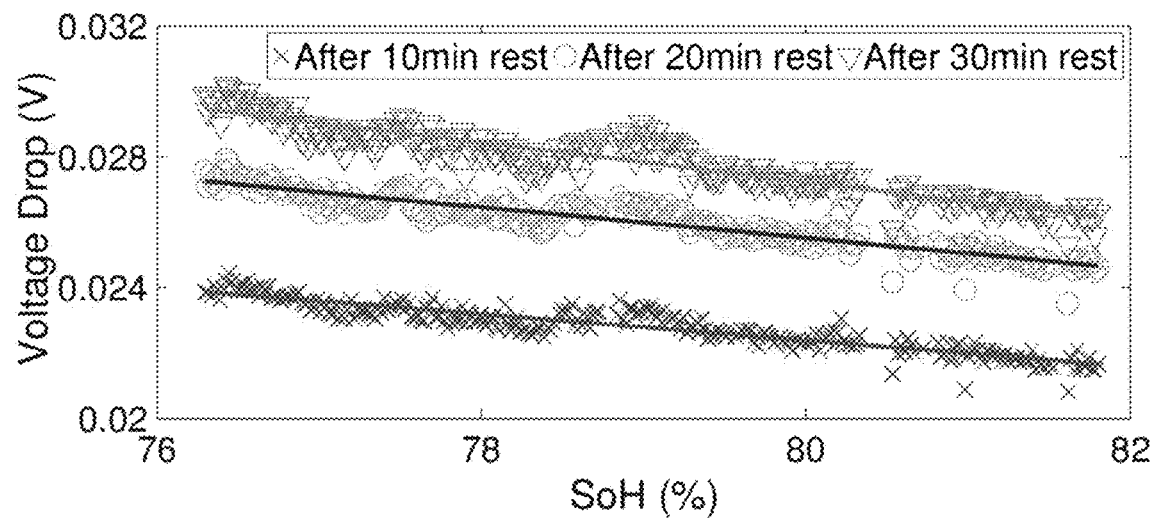
FIG. 13 is a graph illustrating the linearity between voltage drop and SofH.

Each of the collected relaxing voltages covers a 30-minute resting period logged at 1 Hz, yielding 30×60=1,800 dimensions of data. Also, the voltage values in each of these dimensions are correlated. FIG. 10 plots the correlations between each pair of the 1,800 dimensions of the 268 relaxing voltages selected from FIG. 4, where strong correlations (with correlation coefficients ≈3.8 or higher) are observed in most cases. In the example embodiment, dimensions are reduced by applying principal component analysis (PCA). Such highly-correlated, high-dimension relaxing voltages justify V-Health estimation method's use of PCA for reduction of dimensions, lowering the computational effort in constructing the fingerprint map. Again, taking the measurements in FIG. 4 as an example, applying PCA reduces the relaxing voltage dimensions from 1,800 to 35 with a variance of 99%. These resulting voltage measurements in turn serve as the present mode or the fingerprint. In some embodiments, it is understood that other reduction methods may be applied or that dimension reduction may be omitted.

In the example embodiment, the V-Health estimation method uses a regression tree to construct the fingerprint map, with the above-obtained principal components as predictors and the corresponding SoH as response. FIG. 11 plots the confusion matrices when validating the constructed regression model for each battery, showing over 95% classification accuracy when forming 5 SoH categories with 4% step-size. Note that this 4% step-size is only for visual clarity, and a more fine-grained step-size of 0.1% SoH is used for the evaluation of V-Health estimation method later in this disclosure. While the regression tree is used for its simplicity and high interpretability, other comparison methods, such as SVM, KNN, and their variations, also are contemplated by this disclosure. Moreover, other modeling techniques also fall within the scope of this disclosure as well.

The constructed fingerprint map has to be applicable for all same-model batteries, which can be verified with the following two statistical observations. First, the SoH degradation of the four batteries used in the measurements are highly correlated, as shown in Table 4 below.

TABLE 4

| Battery | #1 | #2 | #3 | #4 |
|---|---|---|---|---|
| #1 | 1 | 0.939 | 0.931 | 0.930 |
| #2 | 0.989 | 1 | 0.988 | 0.980 |
| #3 | 0.981 | 0.988 | 1 | 0.984 |
| #4 | 0.980 | 0.980 | 0.984 | 1 |

Second, one can evaluate the similarity between the SoH degradation processes of the four batteries via dynamic time warping, and the resultant warping paths are close to the diagonal of the degradation matrix for each battery pair, exhibiting strong similarity. These insights support V-Health estimation method's generality of training the fingerprint map with one (or more) battery and its application to other same-model batteries. The cross-battery estimation accuracy is evaluated later in this disclosure.

Figure 15:
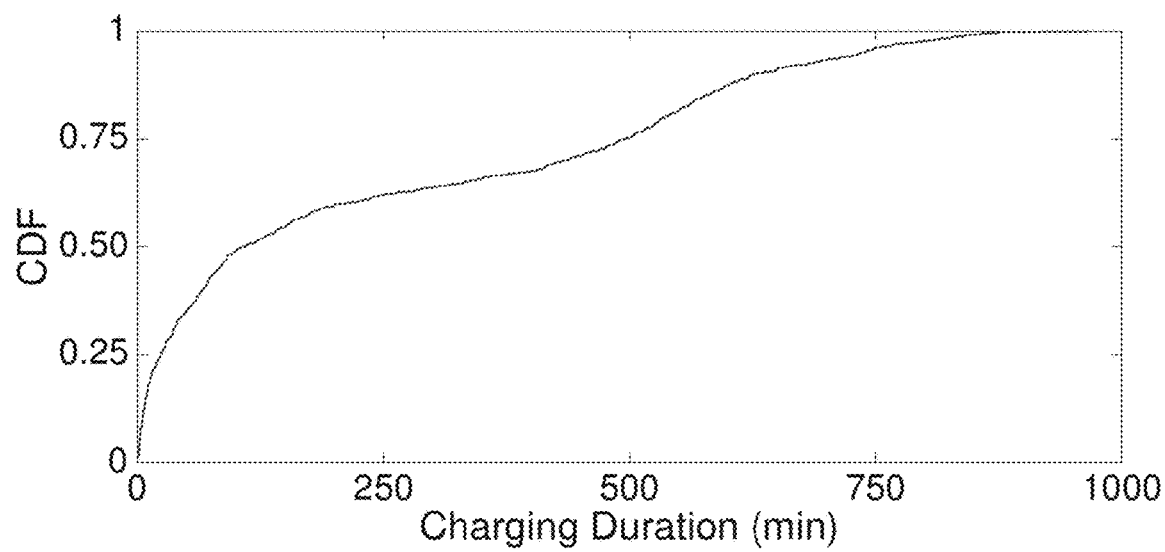
FIG. 15 is a graph showing how long users often charge devices overnight.

Ideally, V-Health estimation method is to be provided by OEMs because of their accessibility to battery cycling datasets, e.g., covering a complete battery SoH range. In case a limited dataset is available, it can be extrapolated based on the linearity between voltage drop during resting and battery SoH. Again, the cycling measurements in FIG. 4 are used to show this observation. FIG. 15 plots the voltage drop after the battery is rested for 10, 20 and 30 minutes during the resting period of each cycle, together with the corresponding battery SoH during that cycle. One can see clear linearity in all three traces of dropped voltages, with RMSE in the order of 10 after linear fitting. This observation enables one to identify the linear coefficients based on the available cycling dataset, generate relaxing voltages that correspond to uncovered SoH, and eventually construct the complete voltage fingerprint map.

Figure 14A:
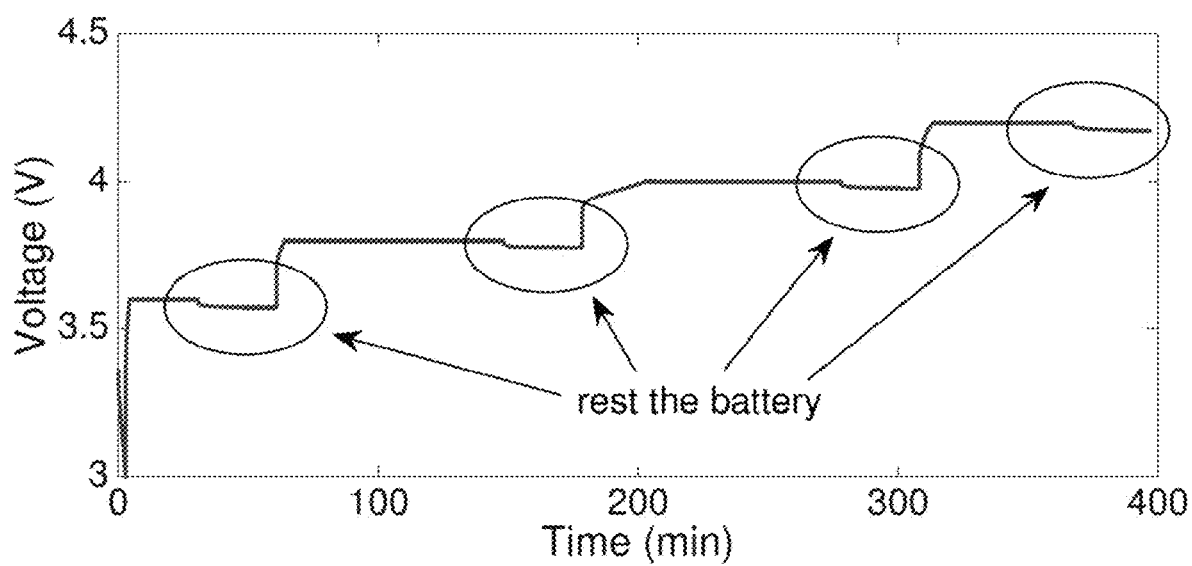
FIGS. 14A-14B are graphs showing how the relaxing time is affected by starting voltage level of the battery.
Figure 14B:
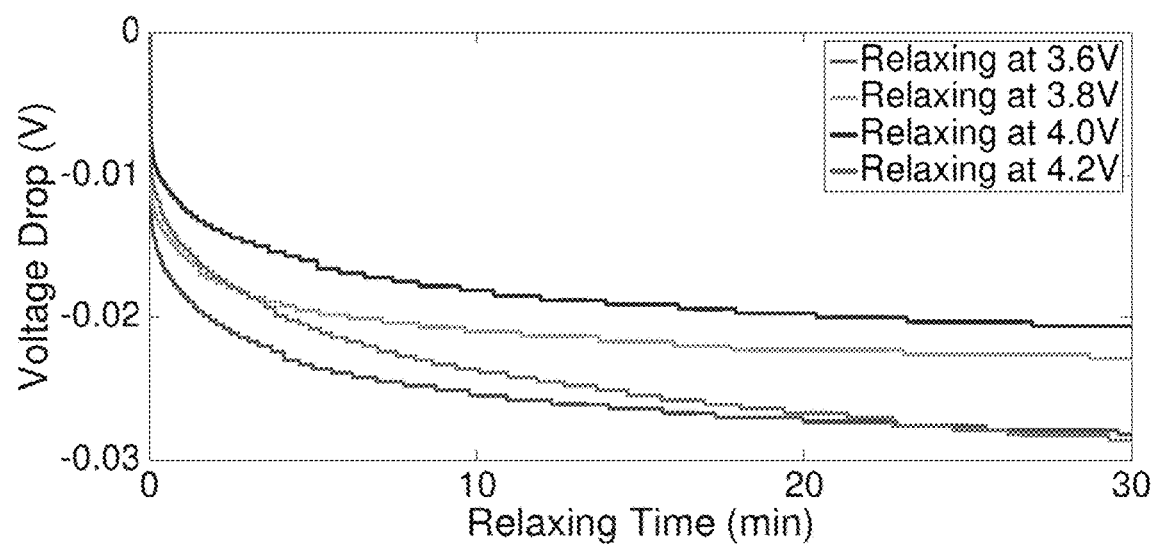

Collecting relaxing voltages on mobile devices is described further. The relaxing voltages are not always collectable on mobile devices for the following reasons. First, the relaxing voltage requires batteries to be idle (i.e., during the 30-minute resting period in the cycling measurements). Mobile devices, however, discharge their batteries with continuous and dynamic currents even in idle mode, due to device monitoring and background activities. Also, battery voltage is temperature-dependent, so a stable thermal environment is required to collect the relaxing voltages. This is challenging due to the well-publicized device overheating problem. Last but not the least, the relaxing voltage is affected by its starting voltage. FIG. 14 compares the relaxing voltage when resting the battery at different voltages within [3.6, 4.2] V, showing a clear dependency between the relaxing voltage and its starting voltage level. Such dependency requires a unified starting voltage for the collection of relaxing voltages.

V-Health estimation method mitigates these challenges based on the fact that users often charge their devices over-night—the charging duration is so long that the charger is kept connected even after the device is fully charged. FIG. 15 plots the charging time (i.e., the time from the charger's connection to disconnection) distribution of 976 charging cases collected from 7 users over 1-3 months, showing 34% of them lasted over 6 hours and are long enough to keep the charger connected after the device was fully charged, due to the common over-night charging. In the example embodiment, V-Health estimation method starts to collect the relaxing voltage once the battery reaches 100% SoC during over-night charging, and stops it when the charger is disconnected. This collection of relaxing voltages mitigates all the above-mentioned challenges.

Figure 16:
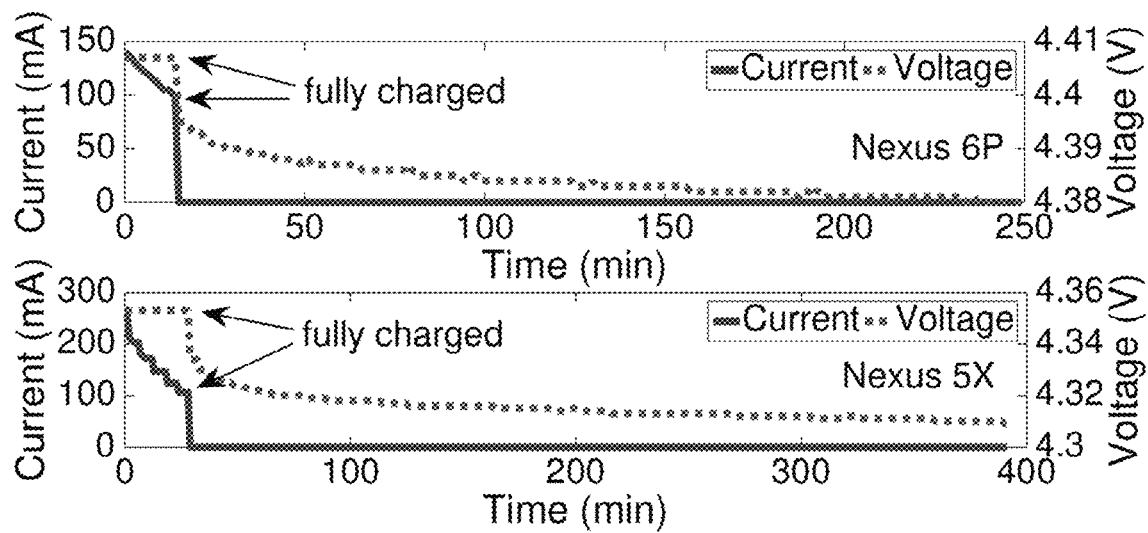
FIG. 16 is a graph showing resting voltages after overnight charging.
Figure 17:
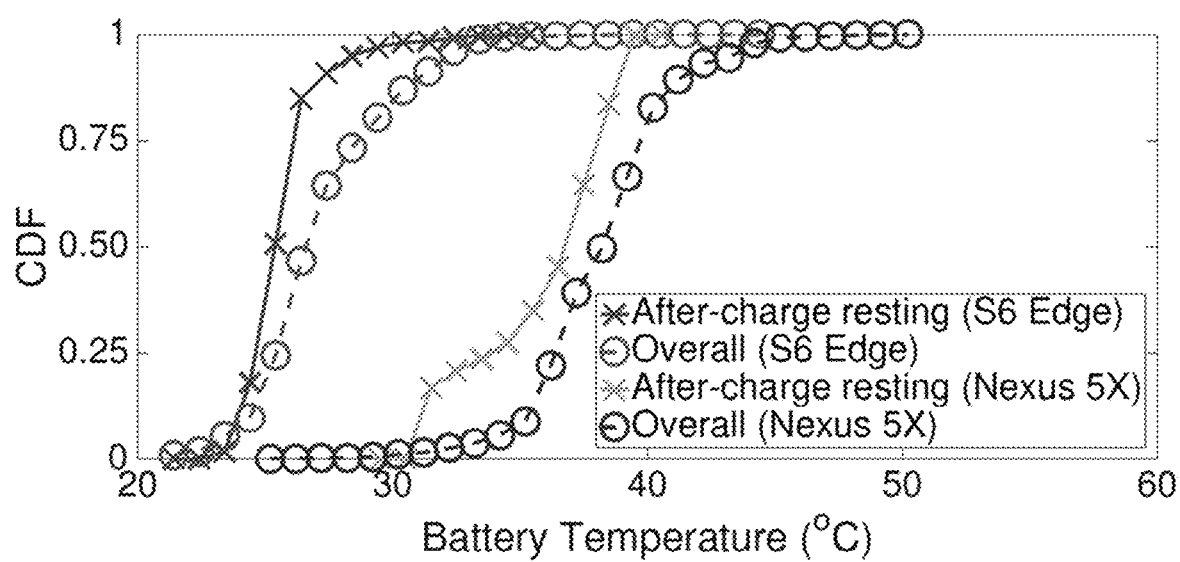
FIG. 17 is a graph showing that temperature is stable during resting.

First, overnight device charging rests its battery. Commodity chargers use separate power paths to charge the battery and power the device, resting the battery if the charger is kept connected even after the battery reaches 100% SoC, as in overnight charging. FIG. 16 shows such rested batteries, where the chargers are kept connected after fully charging a Nexus 6P and a Nexus 5X phone, and their battery voltage and current are recorded—the current reduces to, and stays at 0 mA after fully charging the battery and thus resting the battery; the battery voltage first instantly and then gradually drops, agreeing with FIG. 4. Second, overnight charging provides the battery a relatively stable thermal environment. Most mobile devices charge their batteries with CCCV, during which the CV-Chg phase takes long at a low charging rate, thus not heating the battery much and allowing for its equilibration. This way, the battery operates in a stable thermal environment during the resting period after the CV-Chg phase completes (and thus, the battery is fully charged). To verify this, one can monitor the battery temperature of Galaxy S6 Edge and Nexus 5X phones during an 8-day real-life usage. FIG. 17 compares the temperature distribution during the resting periods after fully charging them with that under normal usage, showing reduced thermal variations, e.g., the temperature range of the Nexus 5X battery is narrowed from 25-50° C. in normal case to 29-39° C. when resting. Finally, collecting relaxing voltages after the battery is fully charged unifies the starting voltage at the fully charged level, e.g., 4.37V for Galaxy S6 Edge.

Figure 18A:
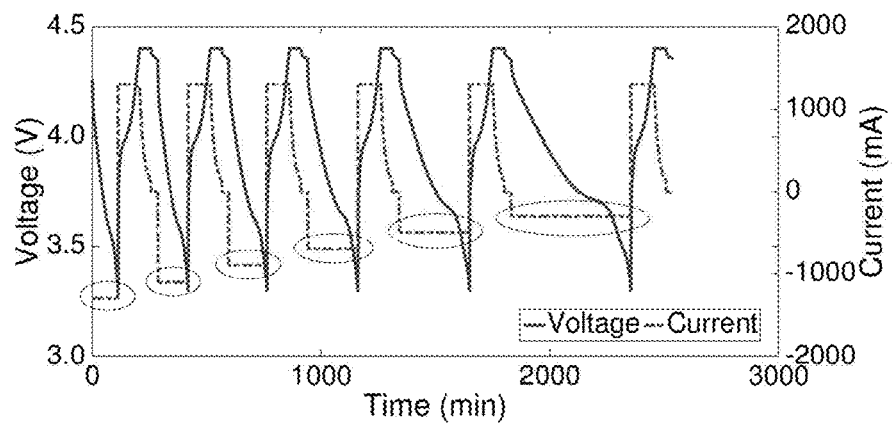
FIGS. 18A-18C are graphs showing that relaxing voltages after charging are insensitive to discharging.
Figure 18B:
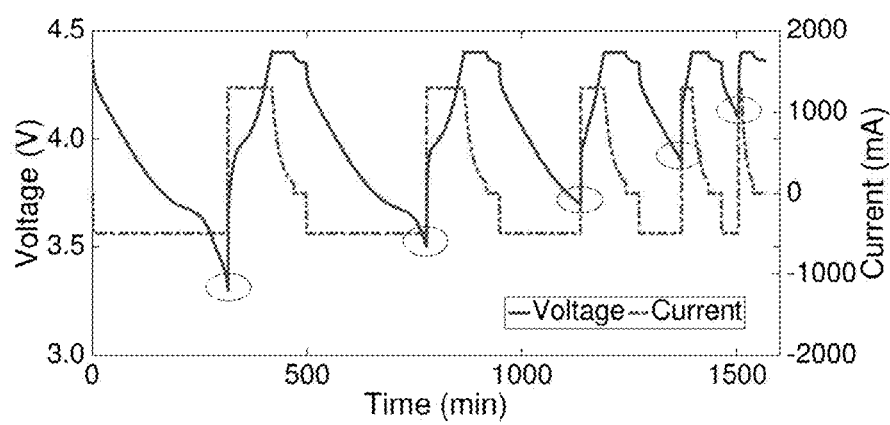
Figure 18C:
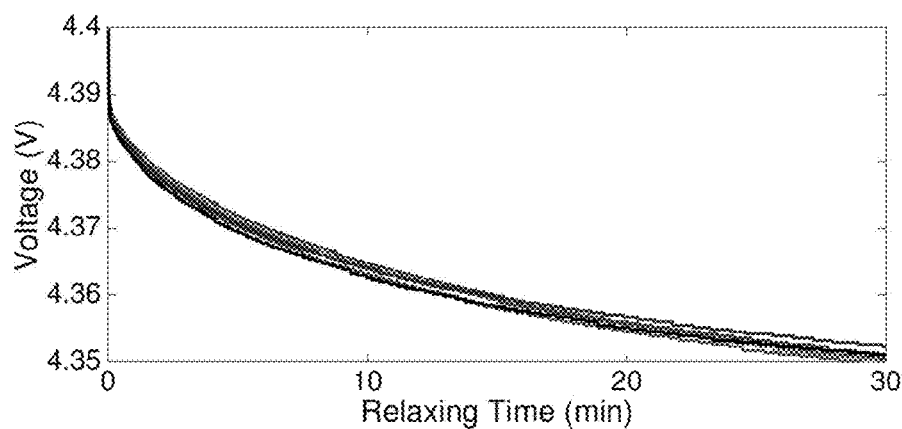

One must also consider if a device's usage pattern (i.e., how its battery is discharged) affects its after-charging relaxing voltages. To this end, one discharge, charge, and then rest a Galaxy S4 battery for (i) 6 cycles with different discharging currents within mA (FIG. 18A), and (ii) another 5 cycles with a different cutoff voltage within V (FIG. 18B). The thus-collected 6+5=11 relaxing voltage traces during each resting period are plotted in FIG. 18C. These relaxing voltages are very close to each other (e.g., in comparison with FIG. 12), exhibiting their insensitivity to previous discharging and thus reliability. Again, this is because the charging, especially CV-Chg, of the battery masks the disturbance caused by their previous discharging from the resting period after being fully charged.

Figure 19A:
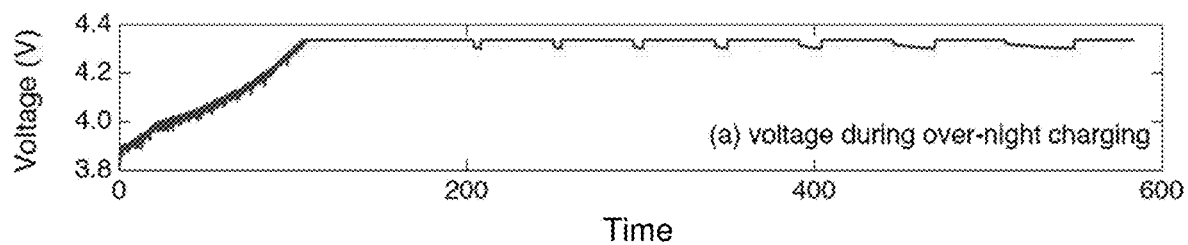
FIGS. 19A-19D are graphs showing that trickle charging pollutes the collected relaxing voltages and how to extract sub-traces from the polluted traces.
Figure 19B:
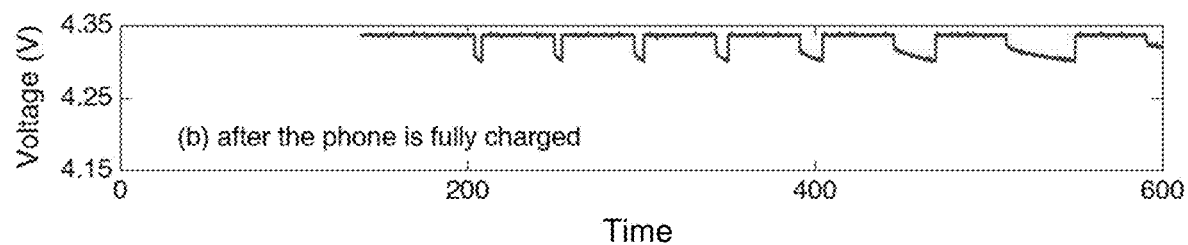

Certain mobile devices (e.g., Galaxy 36 Edge, Galaxy S4, etc.) use trickle charging—charging a fully charged battery under no-load at a rate equal to its self-discharge rate—to keep their battery at 100% SoC, which invalidates the battery resting and thus pollutes the collected relaxing voltages. Specifically, these devices trigger trickle charge once the voltage of a fully-charged battery has dropped for a pre-defined value, e.g., 20 mV for Galaxy S6 Edge and 40 mV for Galaxy S4, and stop the trickle charging after the battery is fully charged again. FIG. 19A plots the voltage of a Galaxy S4 phone during an over-night charging, during which trickle charging is triggered 7 times after the phone is fully charged, as shown in FIG. 19B. The duration between two consecutive trickle chargings increases because the battery OCV approaches the fully-charged level.

Figure 19C:
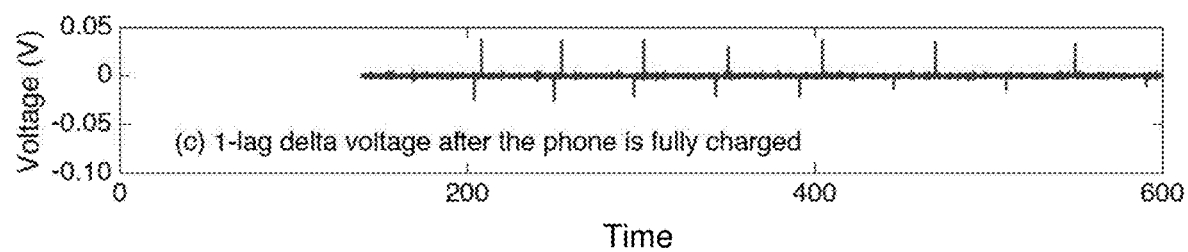
Figure 19D:
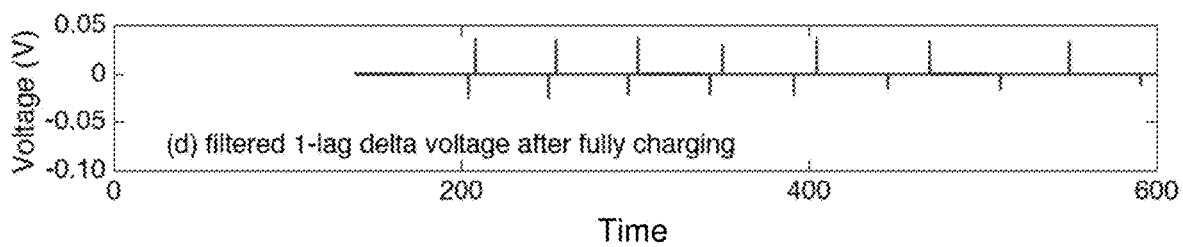

Trickle charging prevents battery from resting and thus pollutes the relaxing voltages. V-Health estimation method extracts relaxing sub-traces from the polluted trace with a simple observation that a sudden increase/drop of battery voltage indicates the triggering/stopping of trickle charging. Specifically, V-Health estimation method calculates the I-lag delta voltage after the device is fully charged (FIG. 19C), and passes it through a low-pass filter (FIG. 19D). This way, V-Health estimation method extracts the relaxing sub-traces by locating the peaks and valleys in the trace. Power fitting is then applied to thus-extracted sub-traces, which are concluded to be valid if the goodness-of-fit is acceptable.

The sub-traces, however, may not be long enough to form a fingerprint. To remedy this problem, V-Health estimation method uses the sub-traces to determine the constants of the power function. The power function can then be used to predict the entire voltage trace without interruptions. The predicted traces can then be used to determine SofH in the manner set forth above.

Multiple relaxing sub-traces are likely to be collected and recovered during a single over-night charging (as in FIG. 19), and thus multiple SoH estimations may be made. V-Health estimation method uses the average of such estimations as the raw battery SoH. Also, there may be fluctuations among the raw SoH obtained from different over-night chargings. V-Health estimation method further uses a first-order smoother (i.e., estimating the current SoH by linear fitting current and previous raw SoH estimations) to mitigate such fluctuations, and reports the smoothed result as the final battery SoH to users. Such mitigation of fluctuations is also used in the SoC estimation of mobile devices.

First, V-Health estimation method is evaluated based on the measurements summarized in Table 3. Relaxing voltages covering a 30-minute resting period are used as the fingerprint unless specified otherwise. For comparison, a base-line method, V-Drop, was implemented which is grounded on the assumption that the voltage drop after 5-minute relaxation is linear in battery SoH. This is an improved version of method described by L. Casals, et al in "Phev battery aging study using voltage recovery and internal resistance from onboard data" IEEE Transactions on Vehicular Technology (June 2016) by tuning it to the after-charging relaxation scenario instead of the original after-discharging case, thus removing its additional assumption that the relaxing voltage is collected at the same SoC after discharging the battery in similar patterns.

Figure 20A:
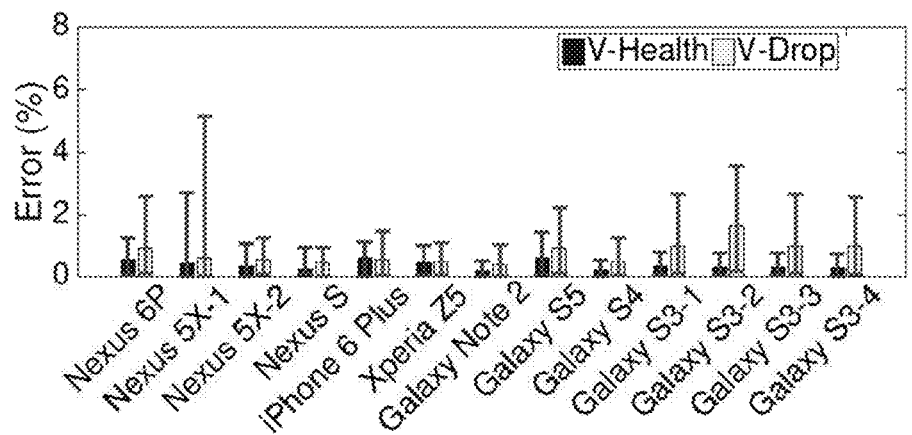
FIGS. 20A-20F are graphs showing lab experiment results for the proposed estimation method.

First, V-Health estimation method is evaluated based on the dataset collected with each of the batteries, whose results are summarized in FIG. 20A, in terms of the 5th and 95th percentiles of estimation errors (in absolute value) and their mean. V-Health estimation method estimates battery SoH with <1% mean error, and most of them are bounded by 0.5%, outperforming V-Drop in all the explored cases. More importantly, V-Health estimation method significantly reduces the variance in estimation error and thus is much more reliable when compared to V-Drop; actually, the worst-case estimation error with V-Drop reaches over 70% of absolute SoH value. Such reliability is achieved by V-Health estimation method's exploitation of a time series of relaxing voltages as the fingerprint, which is much more robust against the variance/noise in the measurements, than V-Drop that relies on a single voltage reading for SoH estimation.

Figure 20B:
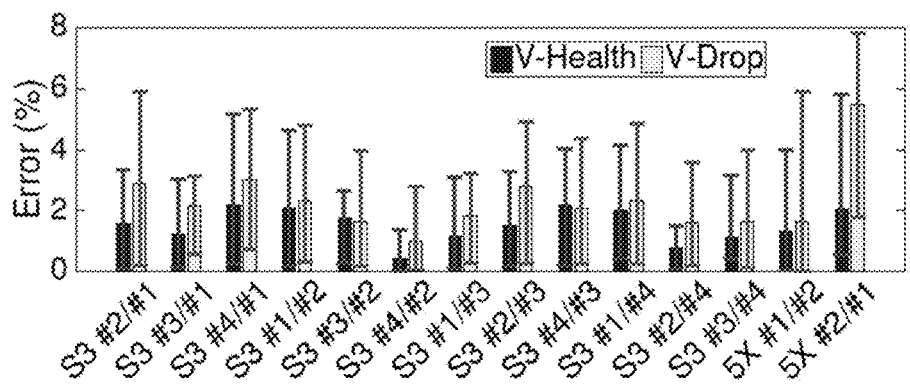

V-Health estimation method is also evaluated by training the fingerprint map with a battery and validate its accuracy with the traces collected with other same-model batteries, i.e., cross-battery validation. This is the real-life analogy of estimating battery SoH of local devices based on an offline-trained fingerprint map. FIG. 20B plots the validation results with four Galaxy S3 and two Nexus 5X batteries, the symbol x/y denotes training with battery-x and validating with battery-y. The estimation error, albeit larger than the same-battery evaluation, is still bounded by 2% in most cases.

Figure 20C:
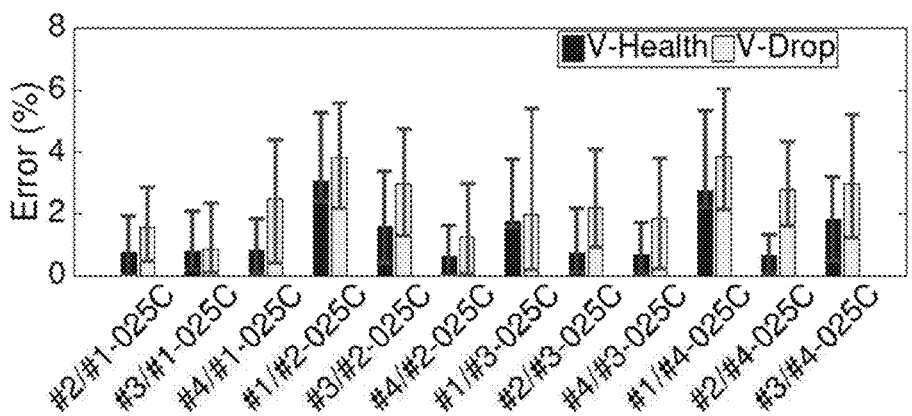

Users may charge their devices with different chargers from day to day, e.g., using USB or DC chargers. Next, cross-profile evaluations are used to verify if V-Health estimation method is tolerable in such heterogeneous charger cases, with the four Galaxy S3 batteries as shown in FIG. 20C. Specifically, V-Health estimation method is trained with the dataset collected when charging with <0.5 C, 4.20V, 0.05 C>$_{cccv}$, and validating its accuracy with the dataset collected when charging with <0.25 C, 4.20V, 0.05 C>$_{cccv}$, i.e., with a constant charging current of 2,200×0.25=550 mA, approximately same as when charging with standard downstream USB 2.0 ports. Comparison of FIGS. 20B and 20C shows no clear evidence of degraded SoH estimation due to different charging profiles—although a few cases resulting in estimation error, the errors in most cases are comparable to FIG. 20B and some are even smaller, verifying V-Health estimation method's robustness against charger heterogeneity.

Figure 20D:
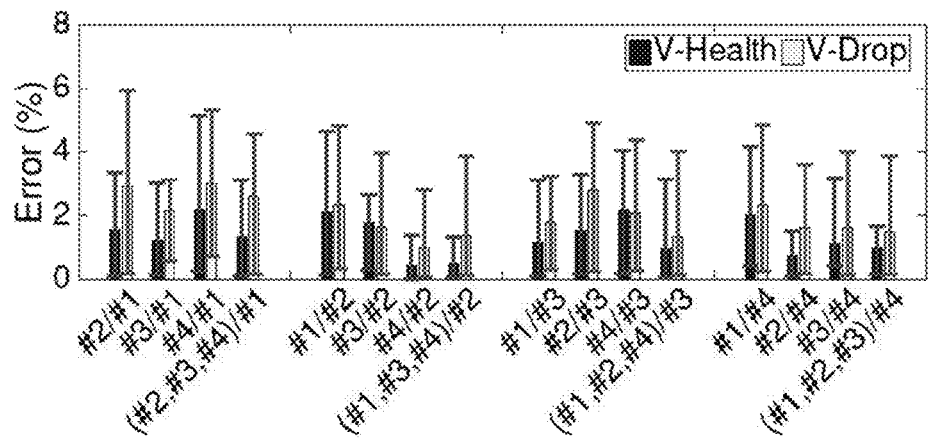

V-Health estimation method's reliability can be improved further by training it with multiple batteries. FIG. 20D plots the SoH estimation error when training V-Health estimation method with three of four Galaxy S3 batteries and using the fourth one for validation, and compares it with cases of single-battery training. The results show that training with multiple batteries reduces the variance in SoH estimation and thus improves V-Health estimation method's reliability, at the cost of slightly increased error as compared to the best case achieved with single-battery training. Note that such best cases, however, are rather random in terms of the battery used for training, as shown in FIG. 20D.

Figure 20E:
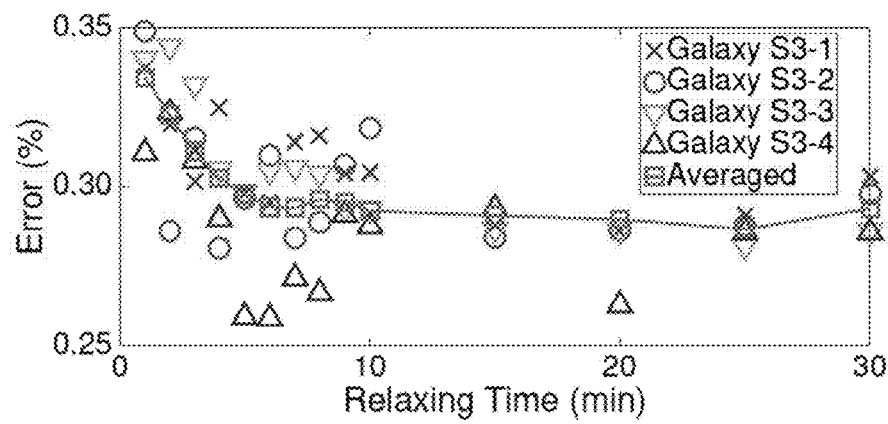
Figure 20F:
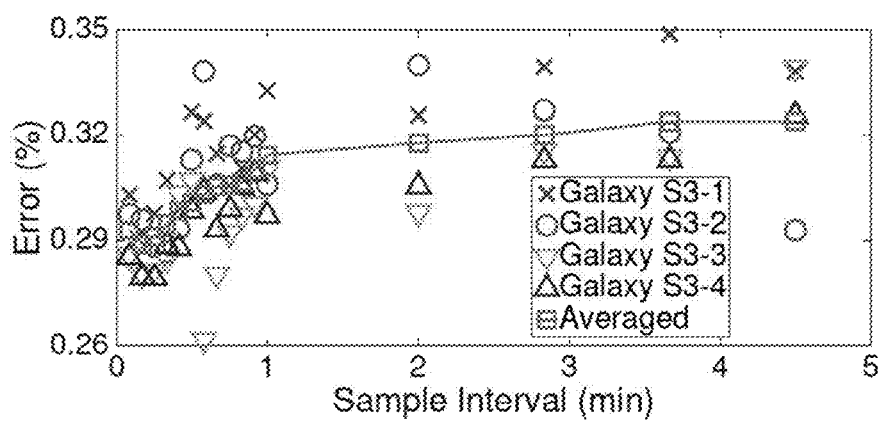

The impact of relaxing time duration and the voltage sampling rates on V-Health estimation method's accuracy in SoH estimation was explored as shown in FIGS. 20E and 20F, respectively. The results show the relaxing time need not be very long, e.g., the estimation error converges with ≈10-minute relaxation, but the 5-minute relaxation in is not enough. Also, V-Health estimation method prefers higher sampling rates for fine-grained relaxing voltages.

V-Health estimation method was also implemented on multiple Android phones, including Galaxy S5, Galaxy S4. Galaxy Note 2, Nexus 6P, and Nexus 5X, and evaluated over 2077 days. These devices are discharged with various combinations of Youtube, flashlight, and an Android App called BatteryDrainer, at an adaptive screen brightness, to a random SoC in the range of 0-70%. The devices are then charged for 6-10 hours during which the relaxing voltages are collected by sampling the system file /sys/class/power_supply/battery/voltage_now. Additional batteries are used for each device module to train their respective fingerprint maps, covering SoH range of 65-97%. The dropped voltages upon resting are used as the fingerprint to remove its dependency on the specific values of fully-charged voltage. The ground truth of the battery SoH of Galaxy S5, Galaxy S4, and Galaxy Note 2 are collected by removing the battery from the phones and fully charging/discharging them with the battery tester, with the same profile as the case of training their respective fingerprint maps. The SoH ground truth of Nexus 6P and Nexus 5X, whose batteries are not removable, is collected via Coulomb counting based on their current log during discharging, located at /sys/class/power_supply/battery/current_now. Although the thus-estimated ground truth may not be perfectly accurate due to the limitation of current sensing, this is the best estimation one can get as non-OEM researchers.

Figure 21A:
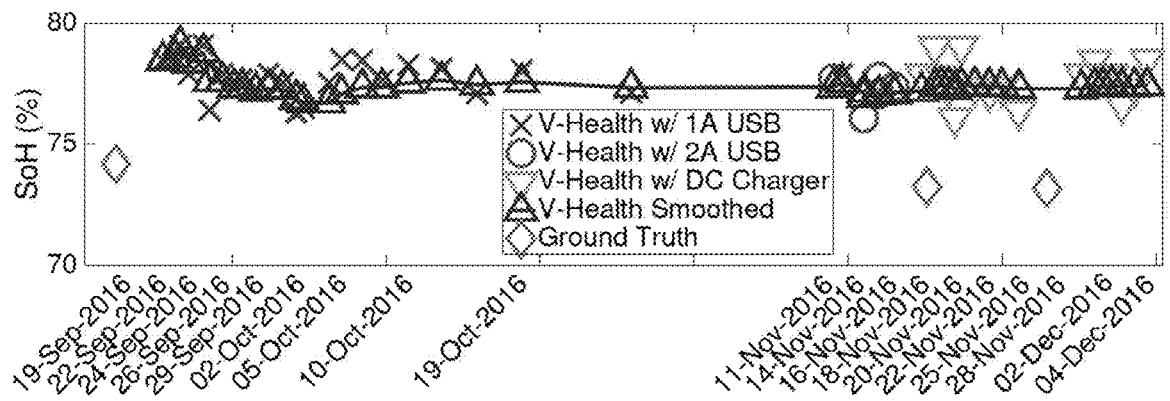
FIGS. 21A-21E are graphs showing field-test results for the proposed estimation method.

FIG. 21A summarizes the estimated battery SoH with Galaxy S5 from 22 Sep. 2016 to Apr. 12, 2016, together with the three ground truth SoHs measured on 19 Sep. 2016, 19 Nov. 2016 and 28 Nov. 2016, showing ≈4 errors in SoH estimation. Also, as stated above, users may charge their devices with different chargers. To cover such cases, we charged the phone with different chargers during the evaluation, namely, 1A USB (22 Sep. 2016-Nov. 11, 2016), 2A USB (Nov. 11, 2016-17 Nov. 2016), and its associated DC charger (18 Nov. 2016-Apr. 12, 2016). No clear dependency on SoH estimation accuracy and the charger selection is observed, demonstrating V-Health estimation method's robustness against heterogeneous chargers. Finally, the first-order smoother reduces the variance and thus the fluctuations of SoH reported to users, as compared to the raw estimations.

Figure 21B:
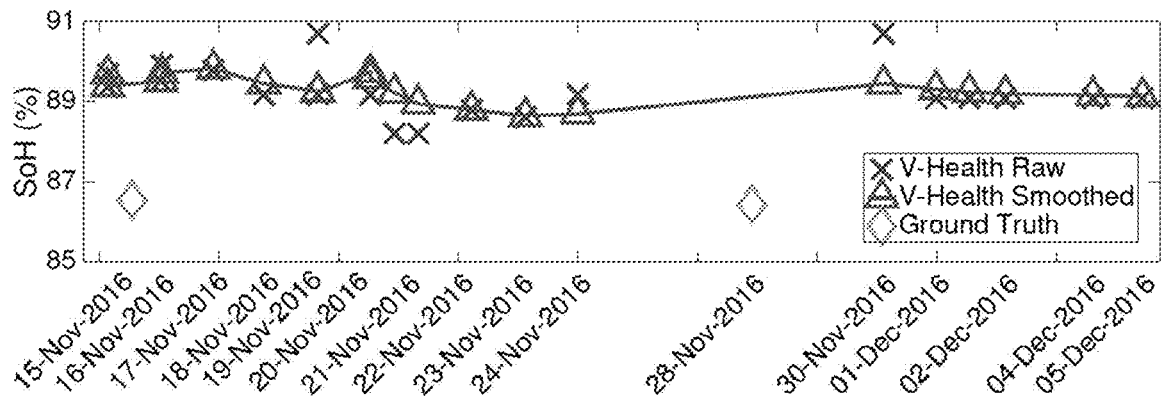
Figure 21C:
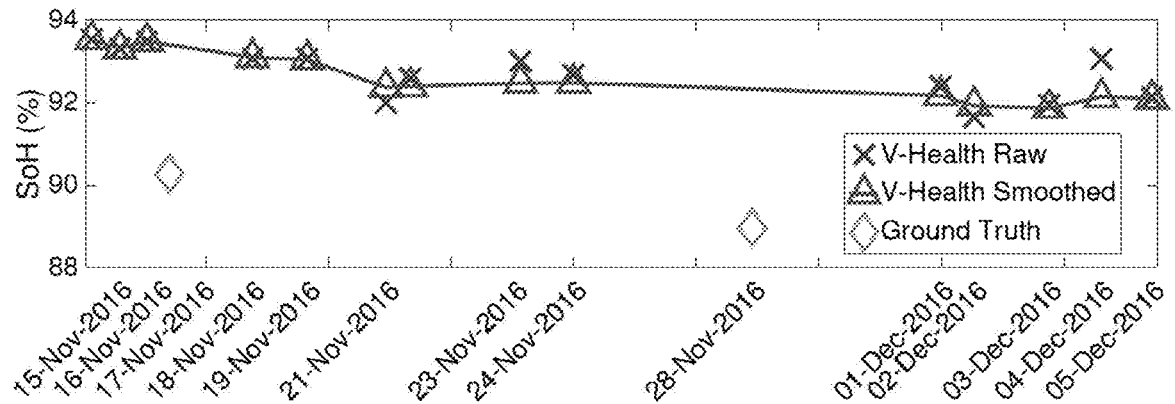

The evaluation results with Galaxy S4 and Note 2 phones are plotted in FIGS. 21B and 21C, showing 2-3.5% estimation error. Note that the battery SoH for Note 2 degrades by ≈1.5% during a 21-day experiment, which is quicker than others. One potential explanation is that the phone has been in storage for about 6 months before these experiments, and thus requires the battery to be cycled a few times before reaching its equilibration, during which its performance changes much faster.

Figure 21D:
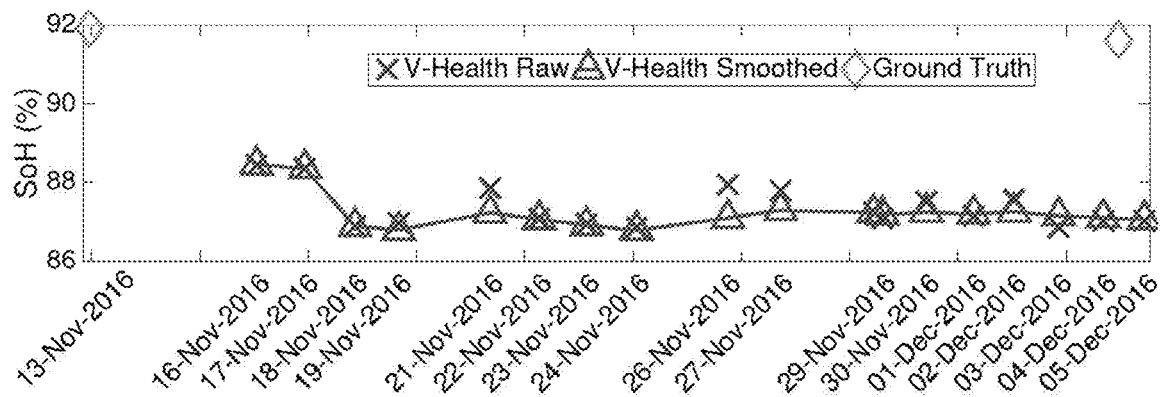
Figure 21E:
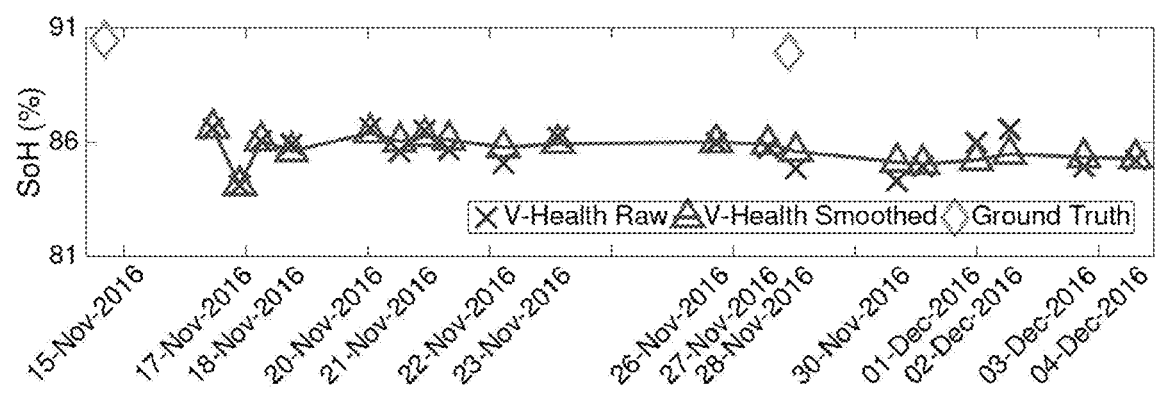

FIGS. 21D and 21E plot the evaluation results with Nexus 6P and Nexus 5X, showing ≈5% error in SoH estimation. This relatively large error could be due partially, besides the inaccurate PMIC-provided current information, to battery's rate-capacity effect—batteries deliver more capacity when discharged with less currents. The two phones have an average discharge current of ≈300 mA when collecting their SoH ground truth, much less than the 0.5 C discharge rate (i.e., 1,725 mA for Nexus 6P and 1,350 mA for Nexus 5X) used in training the fingerprint maps, thus leading to the over-estimation of the batteries' full charge capacity and their SoH. Note that the first-order smoother needs at least 3 samples, causing the initial fluctuation in the smoothed SoH in FIG. 21D.

TABLE 5

| Device | S5 | S4 | Note 2 | 5X | 6P |
| --- | --- | --- | --- | --- | --- |
| Results (ave.) | 52.5% | >400% | 47.3% | <−1,000% | >900% |

Phones' battery SoH were also estimated with V-Drop based on the same set of collected relaxing voltages, as summarized in Table 5. Note that the required voltage drop with 5-minute relaxation may not be available due to trickle charging, in which case we use power fitting to predict such 5-minute-relaxation voltage and then use it to estimate SoH. The SoH estimated by V-Drop has much larger error than V-Health estimation method, and even exceed 100% or below 0% in many cases, indicating its unreliability on phones.

Figure 26:
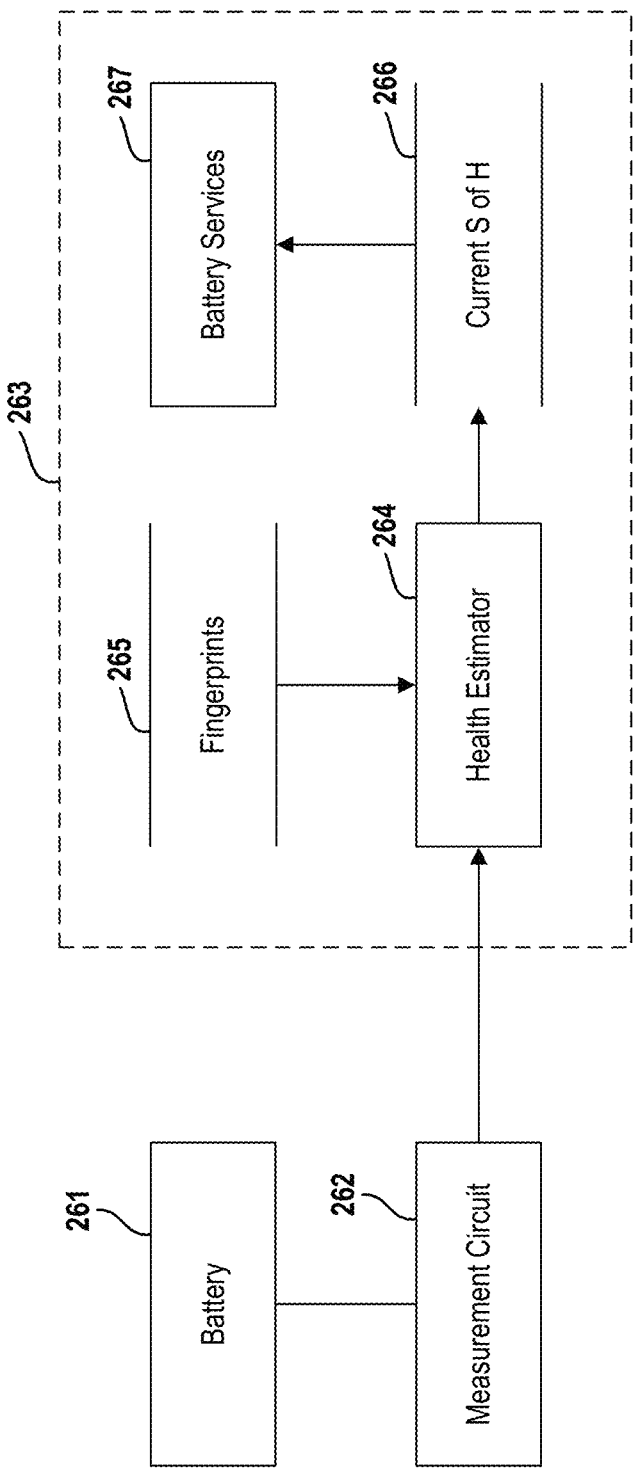
FIG. 26 is a diagram of system for delivering battery services in a mobile device.

FIG. 26 illustrates a system for delivering battery services in a mobile device, such as a phone. The mobile device includes a rechargeable battery 261, a measurement circuit 262 and one or more controllers 263. The measurement circuit 262 is configured to measure the voltage of the battery 261 and/or cells which comprise the battery. In an exemplary embodiment, the controller 263 is implemented as a microcontroller. It should be understood that the logic for the control of the controller can be implemented in hardware logic, software logic, or a combination of hardware and software logic. In this regard, controller can be or can include any of a digital signal processor (DSP), microprocessor, microcontroller, or other programmable device which are programmed with software implementing the above described methods. It should be understood that alternatively the controller is or includes other logic devices, such as a Field Programmable Gate Array (FPGA), a complex programmable logic device (CPLD), or application specific integrated circuit (ASIC). When it is stated that controller performs a function or is configured to perform a function, it should be understood that controller is configured to do so with appropriate logic (such as in software, logic devices, or a combination thereof). It is also understood that only the relevant components of the system are discussed in relation to FIG. 26, but that other components are needed to control and manage the overall operation of the mobile device.

A health estimator is implemented by the controller 263. The health estimator 264 is configured to receive voltage measurements for the battery and estimate the state-of-health (SofH) of the battery in the manner described above. A set of fingerprints for a battery of the same type are derived and stored in a memory device 265 of the mobile device. A SofH estimate for the battery is output by the health estimator 264 and made available to other battery services 267 supported by the mobile device. In one example, the SofH is used to determine remaining usage time of the battery. To illustrate, a Nexus 5X phone is equipped with a battery having a fully charged usable capacity of 2770 mAh. The usable capacity can be adjusted using the SofH. For a SofH of 80%, the fully charged usable capacity is 2216 mAh (i.e., 2770*80%); whereas, for a SofH of 60%, the fully charged usable capacity is 1662 mAh (i.e., 2770*60%). Assuming discharge rate of 1 amp, the adjusted capacity of the battery can be converted to a remaining usage time. For the fully charged battery with 80% SofH, the remaining usage time is 2.2 hours. The remaining usage time can also be computed if the battery is less than fully charged. For battery with 80% SofH and 50% state of charge, the remaining usage time is 1.1 hours (i.e., 2216 mAh*50%/1000 mA=1.1 hours). The remaining usage time for the battery can then be displayed on a display of the mobile device.

In another example, a function being executed on the mobile device can be modified based on the SofH of the battery. Once the SofH of the battery drops below a predefined threshold, select background processes running on the mobile device can be disabled and/or terminated. The SofH can also be used to more accurately compute remaining usage time. Similarly, once the remaining usage time of the battery drops below a predefined threshold, select background processes running on the mobile device can be disabled and/or terminated. Other examples of other battery services which can utilize the SofH of the battery are described below.

Figure 22A:
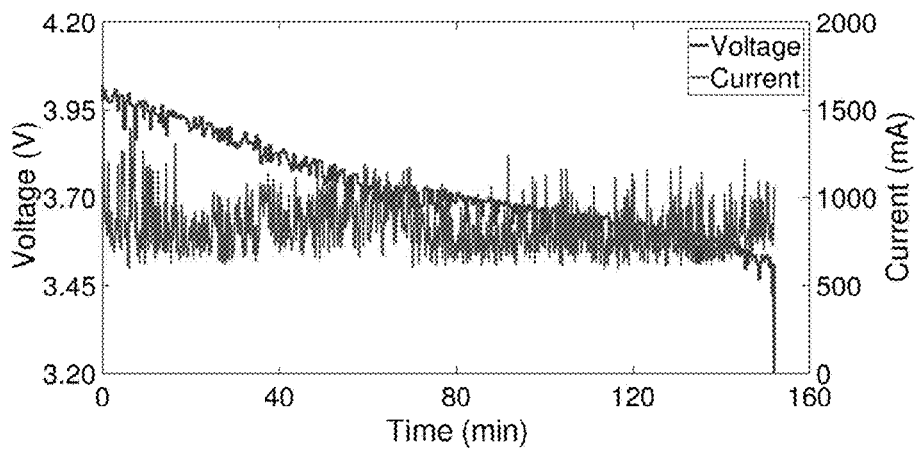
FIGS. 22A-22C are graphs showing state-of-charge and remaining operation time estimation compensated by SofH estimates.
Figure 22B:
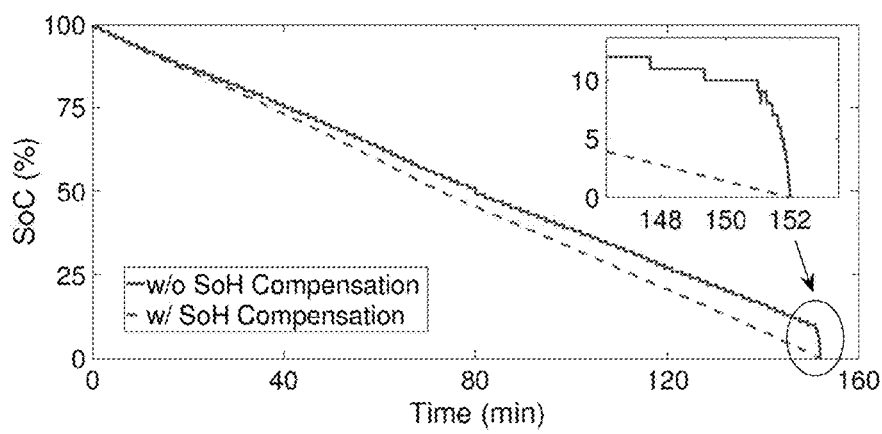
Figure 22C:
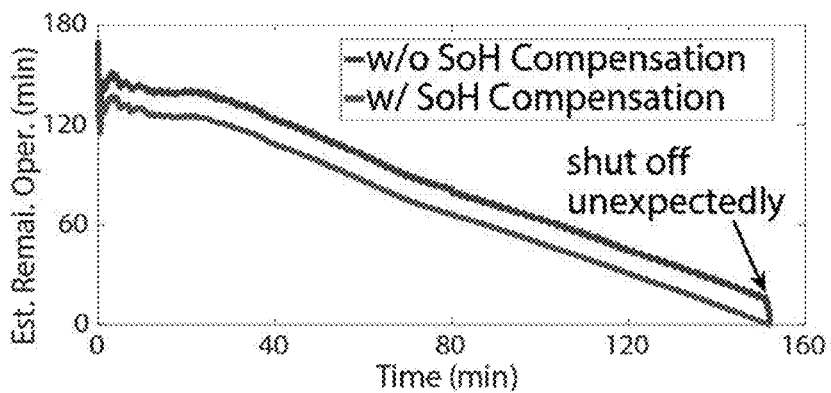

V-Health estimation method also enables four novel use-cases that improve user experience from different perspectives. Besides answering the question "how long will my phone battery last?" with the interpretation of battery lifetime, V-Health estimation method also addresses this question in the remaining device operation time, by facilitating the SoH-compensated SoC estimation and thus the accurate estimation on phones' remaining power supply. FIG. 22A plots the voltage and current when running a fully-charged Xperia Z phone with the BatteryDrainer until shutting off, delivering 2,117 mAh capacity in total and thus indicating an SoH of 2, 117/2, 330=90.9%. FIG. 22B plots the battery SoC shown to the user during the same discharge process—the phone shuts off with ≈10% remaining SoC. Also plotted in FIG. 22B is the battery SoC compensated with the captured SoH degradation, e.g., by V-Health estimation method, which provides users more accurate SoC estimation and thus alleviating shutting the phone off unexpectedly. FIG. 22C plots the thus-estimated remaining operation time based on the same approach used in TI's Impedance Track—the phone shuts off when thinking it can operate 20 minutes longer due to battery degradation, which can be reliably mitigated with the SoH-compensated SoC estimation, enabled by V-Health estimation method. The battery SoH monitoring, enabled by V-Health estimation method, also allows to detect battery's abnormal behavior. This is shown with the example of detecting the loose connection between battery and the device, an issue found on devices such as Lumia 920, iPhone 5, and Note 4. Such loose connection increases the connecting resistance and thus device heating, pronouncing the risks of thermal runaway and even battery explosion if not detected in time. The increased connecting resistance reduces battery's usable capacity; in V-Health estimation method, this is observed as an unusual SoH drop and thus detectable.

Figure 23:
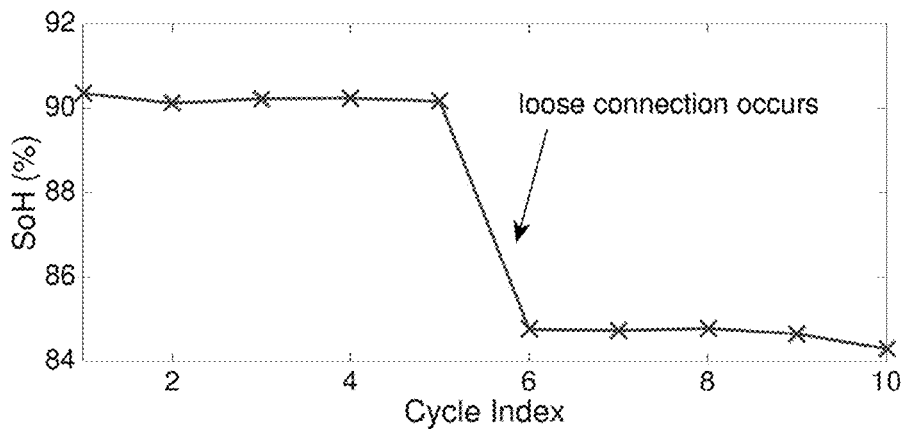
FIG. 23 is a graph showing abnormal battery behavior detection.

Charge/rest/discharge a Galaxy S5 battery for 10 cycles to validate this: the battery is firmly connected to the tester in the first 5 cycles; in the last 5 cycles, a 100 mΩ resistor is inserted between the battery and the tester to emulate their loose connection. FIG. 23 plots the battery SoH reported by V-Health estimation method during these 10 cycles. A clear SoH drop is observed when switching from the firm- to loose-connection settings, validating its detectability of V-Health estimation method. Upon detecting an unusual SofH drop, protective measures can be taken by the mobile device, including but not limited to notifying the operator, disconnecting the battery and/or disabling the device.

Figure 24:
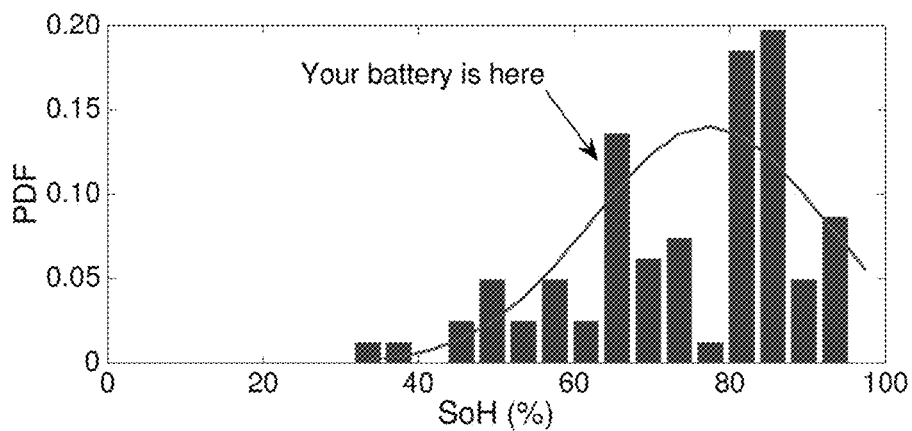
FIG. 24 is a graph showing cross-user battery comparison.

Another use-case enabled by V-Health estimation method is the cross user comparison among batteries of same-model devices, as illustrated in FIG. 24 based on 82 Li-ion batteries used in our laboratory. Such comparison not only allows users to locate their batteries' strength among others, but also facilitates characterization of battery-friendly/harmful usage patterns, when coupled with energy diagnosis services that monitor devices' daily usage, e.g., Carat.

Figure 25:
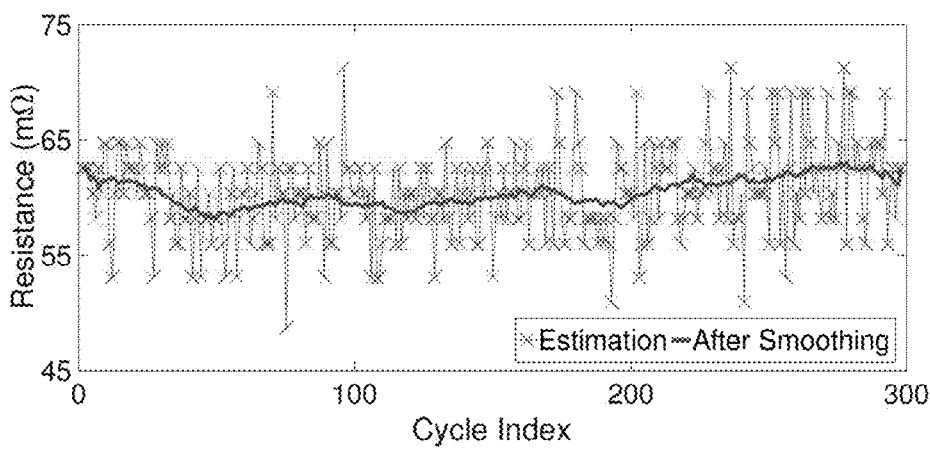
FIG. 25 is a graph showing battery resistance monitoring.

Batteries' internal resistance increases as they age, reducing their usable capacity and pronouncing device heating. Battery resistance is traditionally estimated based on the voltage change when the current switches between two stable levels, i.e., $r=dV/dI$. The requirements on stable current is to eliminate the influence of dynamic current on voltage response, which, however, does not hold on mobile devices in most cases. V-Health estimation method, by collecting the relaxing voltage—the current before the relaxation changes gradually and is small (i.e., during CV-Chg) and no current is applied to the battery after entering relaxation, allows for estimation of battery resistance as a by-product. FIG. 25 plots the estimated resistance of a Galaxy S3 battery based on dV/dI after 1 s relaxation, according to the relaxing voltages collected in FIG. 4. The battery resistance increases from 58 mΩ2 to 63 mΩ2 during the measurements, agreeing with the 68 mΩ2 ground truth measured with a BVIR battery resistance tester after these measurements. This resistance information helps users/OEMs diagnose their device batteries from another angle.

In this disclosure, low-cost user-level battery SoH estimation service is presented for mobile devices based solely on their voltage, and thus is deployable on all commodity mobile devices. V-Health estimation method is inspired by our empirical finding that the relaxing battery voltage fingerprints its SoH, and is steered by 45 battery measurements, consisting of 7,462 charging/resting/discharging cycles in total and lasting over 44 months cumulatively. Four novel use-cases are also enabled by V-Health estimation method, improving mobile users' experience in SoC estimation, abnormal behavior detection, cross-user comparison, and resistance monitoring.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for estimating state-of-health (SofH) of a rechargeable battery powering an apparatus, comprising:
   providing a set of fingerprints for a battery of a given type, where each fingerprint links a quantified SofH for the battery to a given predetermined model for the relaxing voltage of the battery and the given predetermined model describes relaxing voltage of the battery over a fixed period of time while the battery is resting by fitting voltage measurements to an exponential function;
   measuring, by a circuit in the apparatus, voltage of a given battery of the given type over the fixed period of time while the given battery is resting, where the given battery is configured to power the apparatus;
   constructing, by a processor in the apparatus, a present model for the given battery from the voltage measurements; and
   determining a SofH for the given battery by comparing the present model to the set of fingerprints.

2. The method of claim 1 further comprises charging the given battery until the given battery is fully charged and measuring voltage across the given battery after the given battery is fully charged.

3. The method of claim 1 further comprises constructing the present model using regression analysis.

4. The method of claim 1 wherein constructing the present model further comprises
   fitting the voltage measurements to an exponential function;
   filtering out the voltage measurements using the exponential function; and
   smoothing filtered voltage measurements with a moving average, thereby yielding the present model for the given battery.

5. The method of claim 4 wherein the exponential function is further defined as a power function as follows $v(t)=a*t^b+c$ where t is time since start of resting.

6. The method of claim 4 further comprises reducing dimensionality of the voltage measurements by apply principle component analysis.

7. The method of claim 1 further comprises comparing the present model to the set of fingerprints using a regression tree.

8. The method of claim 1 further comprises identifying segments of time when the battery is resting, extracting voltage measurements from the identified segments of time, and constructing the present model from the extracted voltage measurements.

9. The method of claim 1 further comprises adjusting usable capacity of the given battery using the determined SofH of the given battery; converting the adjusted capacity of the given battery to a remaining usage time for the given battery; and displaying the remaining usage time of the given battery on a display of the apparatus.

10. A method for estimating state-of-health (SofH) of a rechargeable battery in a mobile device, comprising:
    storing a set of fingerprints for a battery of a given type in a memory of the mobile device, where each fingerprint links a quantified SofH for the battery to a given predetermined model for the relaxing voltage of the battery and the given predetermined model describes relaxing voltage of the battery over a fixed period of time while the battery is resting by fitting voltage measurements to a power function;
    measuring voltage of a given battery of the given type using a measuring circuit in the mobile device, thereby yield a set of voltage measurements are made over the fixed period of time while the given battery is resting;
    constructing, by a processor in the mobile, a present model for the given battery from the set of voltage measurements using a power function;
    determining, by the processor, a SofH for the given battery by comparing the present model to the set of fingerprints; and
    modifying, by the processor, a function being executed on the mobile device based on the SofH of the given battery.

11. The method of claim 10 further comprises charging the given battery until the given battery is fully charged and measuring voltage across the given battery after the given battery is fully charged.

12. The method of claim 10 further comprises constructing the present model using regression analysis.

13. The method of claim 10 wherein constructing the present model further comprises
    fitting the set of voltage measurements to the power function;
    filtering out measurements from the set of voltage measurements using the power function; and
    smoothing filtered measurements in the set of voltage measurements with a moving average, thereby yielding the present model for the given battery.

14. The method of claim 13 wherein the power function is further defined as $v(t)=a*t^b+c$ where t is time since start of resting.

15. The method of claim 13 further comprises reducing dimensionality of the filtered measurements in the set of voltage measurements by apply principle component analysis.

16. The method of claim 10 further comprises comparing the present model to the set of fingerprints using a regression tree.

17. The method of claim 10 further comprises identifying segments of time when the battery is resting, extracting voltage measurements from the identified segments of time, and constructing the present model from the extracted voltage measurements.

18. The method of claim 10 further comprises adjusting usable capacity of the given battery using the determined SofH of the given battery; converting the adjusted capacity of the given battery to a remaining usage time for the given battery; and displaying the remaining usage time of the given battery on a display of the apparatus.

\* \* \* \* \*

UNITED STATES PATENT AND TRADEMARK OFFICE
CERTIFICATE OF CORRECTION

| | | |
|---|---|---|
| PATENT NO. | : 11,215,675 B2 | Page 1 of 1 |
| APPLICATION NO. | : 16/605893 | |
| DATED | : January 4, 2022 | |
| INVENTOR(S) | : Kang G. Shin et al. | |

It is certified that error appears in the above-identified patent and that said Letters Patent is hereby corrected as shown below:

On the Title Page

(71) after "MICHIGAN", insert --, Ann Arbor, MI (US)--.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*